(12) United States Patent
Minervini

(10) Patent No.: US 7,537,964 B2
(45) Date of Patent: *May 26, 2009

(54) METHOD OF FABRICATING A MINIATURE SILICON CONDENSER MICROPHONE

(75) Inventor: Anthony D. Minervini, Palos Hills, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/538,056

(22) Filed: Oct. 3, 2006

(65) Prior Publication Data

US 2007/0082421 A1    Apr. 12, 2007

Related U.S. Application Data

(62) Division of application No. 09/886,854, filed on Jun. 21, 2001, now Pat. No. 7,166,910.

(60) Provisional application No. 60/253,543, filed on Nov. 28, 2000.

(51) Int. Cl.
*H01L 21/00* (2006.01)
*H04R 31/00* (2006.01)
*H04R 9/08* (2006.01)
*H04M 9/00* (2006.01)

(52) U.S. Cl. .................. 438/113; 438/125; 438/623; 29/594; 29/609.1; 381/355; 381/360; 455/575.1

(58) Field of Classification Search .................. None
See application file for complete search history.

(56) References Cited

U.S. PATENT DOCUMENTS

| 4,127,840 A | 11/1978 | House |
| 4,277,814 A | 7/1981 | Giachino et al. |
| 4,314,226 A | 2/1982 | Oguro et al. |
| 4,533,795 A | 8/1985 | Baumhauer, Jr. et al. |
| 4,628,740 A | 12/1986 | Ueda et al. |
| 4,737,742 A | 4/1988 | Takoshima et al. |
| 4,776,019 A | 10/1988 | Miyatake |
| 4,825,335 A | 4/1989 | Wilner |

(Continued)

FOREIGN PATENT DOCUMENTS

EP    0 077 615 A1    4/1983

(Continued)

OTHER PUBLICATIONS

European Search Report for Application No. 07702957.4 dated Jul. 19, 2007.

(Continued)

*Primary Examiner*—Alonzo Chambliss
(74) *Attorney, Agent, or Firm*—Marshall, Gerstein & Borun LLP

(57) ABSTRACT

A silicon condenser microphone package includes a transducer unit, a substrate, and a cover. The substrate includes an upper surface transducer unit is attached to the upper surface of the substrate and overlaps at least a portion of the recess wherein a back volume of the transducer unit is formed between the transducer unit and the substrate. The cover is placed over the transducer unit and either the cover or the substrate includes an aperture.

24 Claims, 18 Drawing Sheets

U.S. PATENT DOCUMENTS

| | | | |
|---|---|---|---|
| 4,908,805 | A | 3/1990 | Sprenkels et al. |
| 4,910,840 | A | 3/1990 | Sprenkels et al. |
| 5,101,543 | A | 4/1992 | Cote et al. |
| 5,101,665 | A | 4/1992 | Mizuno et al. |
| 5,146,435 | A | 9/1992 | Bernstein |
| 5,151,763 | A | 9/1992 | Marek et al. |
| 5,178,015 | A | 1/1993 | Loeppert et al. |
| 5,257,547 | A | 11/1993 | Boyer |
| 5,357,807 | A | 10/1994 | Guckel et al. |
| 5,408,731 | A | 4/1995 | Berggvist et al. |
| 5,449,909 | A | 9/1995 | Kaiser et al. |
| 5,452,268 | A | 9/1995 | Bernstein |
| 5,459,368 | A | 10/1995 | Onishi et al. |
| 5,477,008 | A | 12/1995 | Pasqualoni et al. |
| 5,490,220 | A | 2/1996 | Loeppert |
| 5,506,919 | A | 4/1996 | Roberts |
| 5,531,787 | A | 7/1996 | Lesinski et al. |
| 5,545,912 | A | 8/1996 | Ristic et al. |
| 5,592,391 | A | 1/1997 | Muyshondt et al. |
| 5,593,926 | A | 1/1997 | Fujihira |
| 5,659,195 | A | 8/1997 | Kaiser et al. |
| 5,712,523 | A | 1/1998 | Nakashima et al. |
| 5,740,261 | A | 4/1998 | Loeppert et al. |
| 5,748,758 | A | 5/1998 | Menasco, Jr. et al. |
| 5,831,262 | A | 11/1998 | Greywall et al. |
| 5,852,320 | A | 12/1998 | Ichihashi et al. |
| 5,870,482 | A | 2/1999 | Loeppert et al. |
| 5,889,872 | A | 3/1999 | Sooriakumar et al. |
| 5,923,995 | A | 7/1999 | Kao et al. |
| 5,939,968 | A | 8/1999 | Nguyen et al. |
| 6,012,335 | A | 1/2000 | Bashir et al. |
| 6,078,245 | A | 6/2000 | Fritz et al. |
| 6,108,184 | A | 8/2000 | Minervini et al. |
| 6,136,419 | A | 10/2000 | Fasano et al. |
| 6,191,928 | B1 | 2/2001 | Rector et al. |
| 6,282,072 | B1 | 8/2001 | Minervini et al. |
| 6,439,869 | B1 | 8/2002 | Seng et al. |
| 6,522,762 | B1 | 2/2003 | Mullenborn et al. |
| 6,594,369 | B1 | 7/2003 | Une |
| 6,621,392 | B1 | 9/2003 | Volant et al. |
| 6,781,231 | B2 | 8/2004 | Minervini |
| 7,003,127 | B1 | 2/2006 | Sjursen et al. |
| 7,080,442 | B2 * | 7/2006 | Kawamura et al. ............ 29/594 |
| 7,166,910 | B2 * | 1/2007 | Minervini .................... 257/704 |
| 7,242,089 | B2 * | 7/2007 | Minervini .................... 257/704 |
| 7,381,589 | B2 * | 6/2008 | Minervini .................... 438/113 |
| 2002/0067663 | A1 | 6/2002 | Loeppert et al. |
| 2002/0102004 | A1 | 8/2002 | Minervini |
| 2003/0052404 | A1 | 3/2003 | Thomas |
| 2003/0133588 | A1 | 7/2003 | Pedersen |
| 2004/0032705 | A1 | 2/2004 | Ma |
| 2004/0184632 | A1 | 9/2004 | Minervini |
| 2005/0018864 | A1 | 1/2005 | Minervini |
| 2005/0069164 | A1 | 3/2005 | Muthuswamy et al. |
| 2005/0185812 | A1 | 8/2005 | Minervini |
| 2006/0157841 | A1 | 7/2006 | Minervini |

FOREIGN PATENT DOCUMENTS

| | | |
|---|---|---|
| EP | 0 774 888 A2 | 5/1997 |
| FI | 981413 | 12/1999 |
| JP | 07-099420 | 4/1995 |
| JP | 09-107192 | 4/1997 |
| JP | 09-318650 | 12/1997 |
| JP | 2000-165999 | 6/2000 |
| JP | 2000-277970 | 10/2000 |
| JP | 2000-316042 | 11/2000 |
| WO | WO-01/19133 A1 | 3/2001 |
| WO | WO-02/15636 A2 | 2/2002 |
| WO | WO-02/45463 A2 | 6/2002 |
| WO | WO-2006/020478 A1 | 2/2006 |
| WO | WO-2006/061058 A1 | 6/2006 |

OTHER PUBLICATIONS

Scheeper, P.R. et al., "A Review of Silicon Microphones", Sensor and Actuators Actuators, A 44 (1994) pp. 1-11.

Rosenberger, M.E., "Absolute Pressure Transducer for Turbo Application", 820320, pp. 77-79.

Notice of Investigation, Inv. No. 337-TA-629, in the Matter of "Certain Silicon Microphone Packages and Products Containing the Same", United States International Trade Commission, issued Jan. 3, 2008.

* cited by examiner

METHOD OF FABRICATING A MINIATURE SILICON CONDENSER MICROPHONE

RELATED APPLICATION

This application is a division of U.S. application Ser. No. 09/886,854, filed Jun. 21, 2001, which claims the benefit of Provisional Patent Application Ser. No. 60/253,543 filed Nov. 28, 2000.

TECHNICAL FIELD

The present invention relates generally to a housing for a transducer. More particularly, this invention relates to a miniature silicon condenser microphone comprising a housing for shielding a transducer produced on the surface of a silicon die. The silicon die must be packaged to produce a functional microphone of this type.

BACKGROUND OF THE INVENTION

There have been a number of disclosures related to building microphone elements on the surface of a silicon die. Certain of these disclosures have come in connection with the hearing aid field for the purpose of reducing the size of the hearing aid unit. While these disclosures have reduced the size of the hearing aid, they have not disclosed how to protect the transducer from outside interferences. For instance, transducers of this type are fragile and susceptible to physical damage. Furthermore, they must be protected from light and electromagnetic interferences. Moreover, they require an acoustic pressure reference to function properly. For these reasons, the silicon die must be shielded.

Some shielding practices have been used to house these devices. For instance, insulated metal cans or discs have been provided. Additionally, DIPS and small outline integrated circuit (SOIC) packages have been utilized. However, the drawbacks associated with manufacturing these housings, such as lead time, cost, and tooling, make these options undesirable.

SUMMARY OF THE INVENTION

The present invention is directed to a silicon condenser microphone package which allows acoustic energy to contact a transducer which provides the necessary pressure reference while at the same time protects the transducer from light, electromagnetic interference, and physical damage. A silicon condenser microphone package comprises a transducer, a substrate, and a cover. The substrate has an upper surface with a recess formed therein. The transducer is attached to the upper surface of the substrate and overlaps at least a portion of the recess so that a back volume of the transducer is formed between the transducer and the substrate. The cover is placed over the transducer and includes an aperture adapted for allowing sound waves to reach the silicon condenser transducer.

Other features and advantages of the invention will be apparent from the following specification taken in conjunction with the following drawings.

BRIEF DESCRIPTION OF THE DRAWINGS

FIG. 14b is a plan view of a layer of the laminated bottom portion of FIG. 14a;

FIG. 14c is a plan view of a layer of the laminated bottom portion of FIG. 14a;

FIG. 14d is a plan view of a layer of the laminated bottom portion of FIG. 14a;

DETAILED DESCRIPTION OF THE PREFERRED EMBODIMENTS

Figure 1:
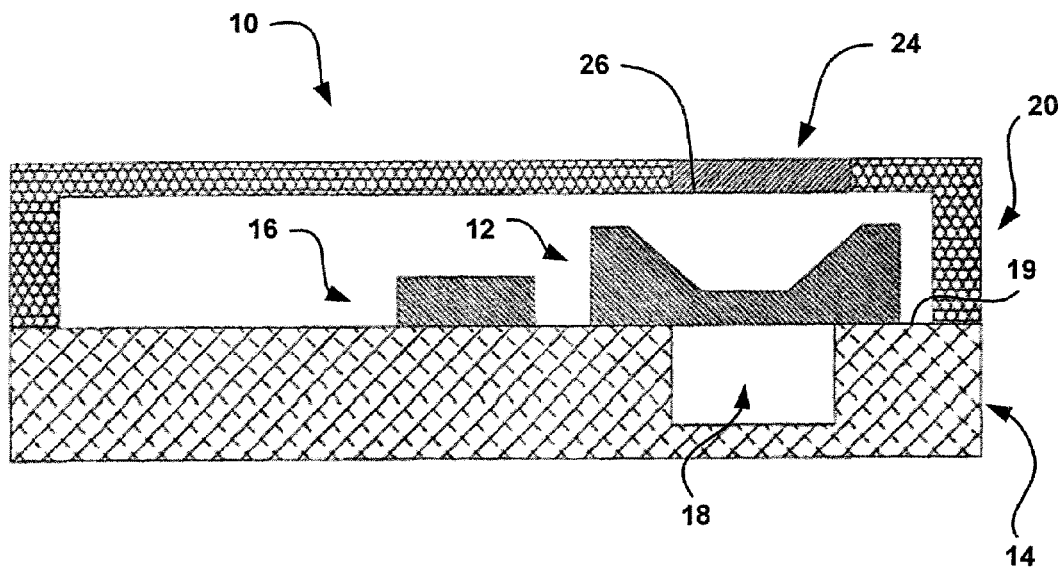
FIG. 1 is a cross-sectional view of a first embodiment of a silicon condenser microphone of the present invention.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention is directed to microphone packages. The benefits of the microphone packages disclosed herein over microphone packaging utilizing plastic body/lead frames include the ability to process packages in panel form allowing more units to be formed per operation and at much lower cost. The typical lead frame for a similarly functioning package would contain between 40 and 100 devices connected together. The present disclosure would have approximately 14,000 devices connected together (as a panel). Also, the embodiments disclosed herein require minimal "hard-tooling." This allows the process to adjust to custom layout requirements without having to redesign mold, lead frame, and trim/form tooling.

Moreover, these embodiments have a better match of thermal coefficients of expansion with the end user's PCB since this part would typically be mounted on FR-4 which is the same material used by end users. The present designs may also eliminate the need for wire bonding that is required in plastic body/lead frame packages. The foot print is typically smaller than that would be required for a plastic body/lead frame design since the leads are formed by plating a through-hole in a circuit board of which one half will eventually form the pathway to the solder pad. In a typical plastic body/lead frame design, a gull in which the leads are disposed, widen the overall foot print.

Figure 2:
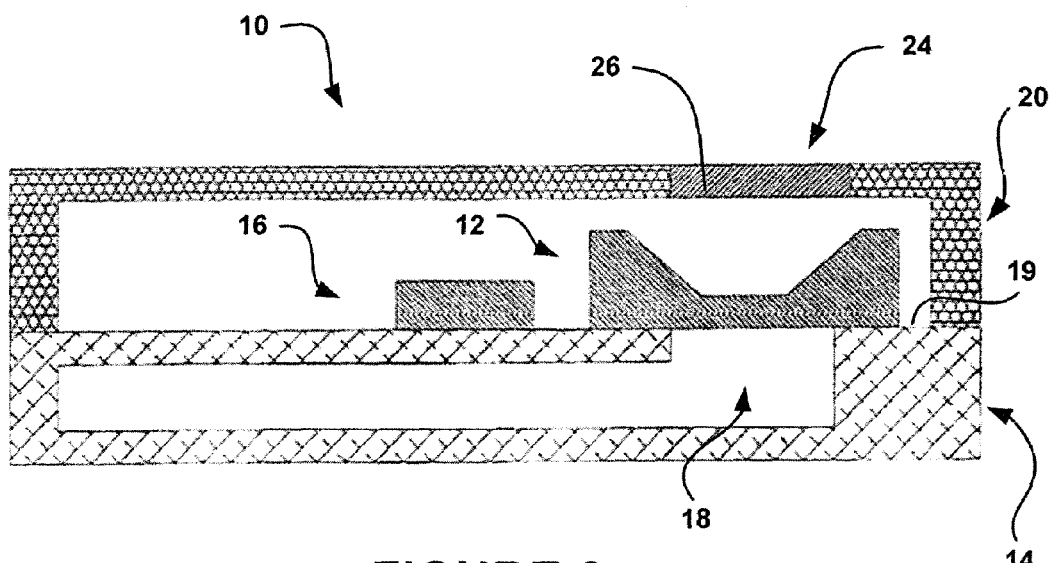
FIG. 2 is a cross-sectional view of a second embodiment of a silicon condenser microphone of the present invention.
Figure 3:
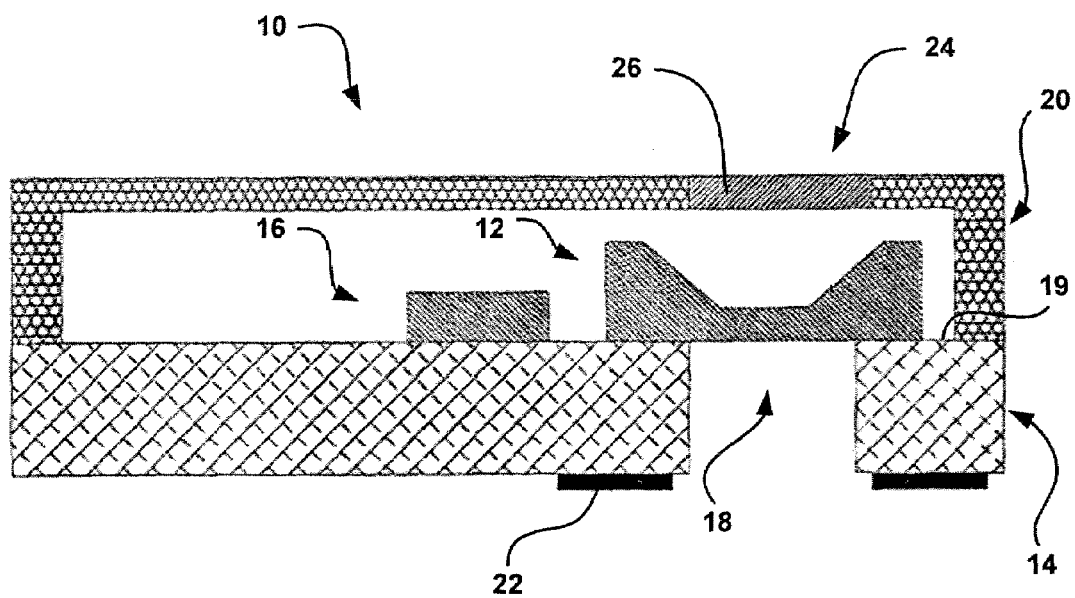
FIG. 3 is a cross-sectional view of a third embodiment of a silicon condenser microphone of the present invention.
Figure 6:
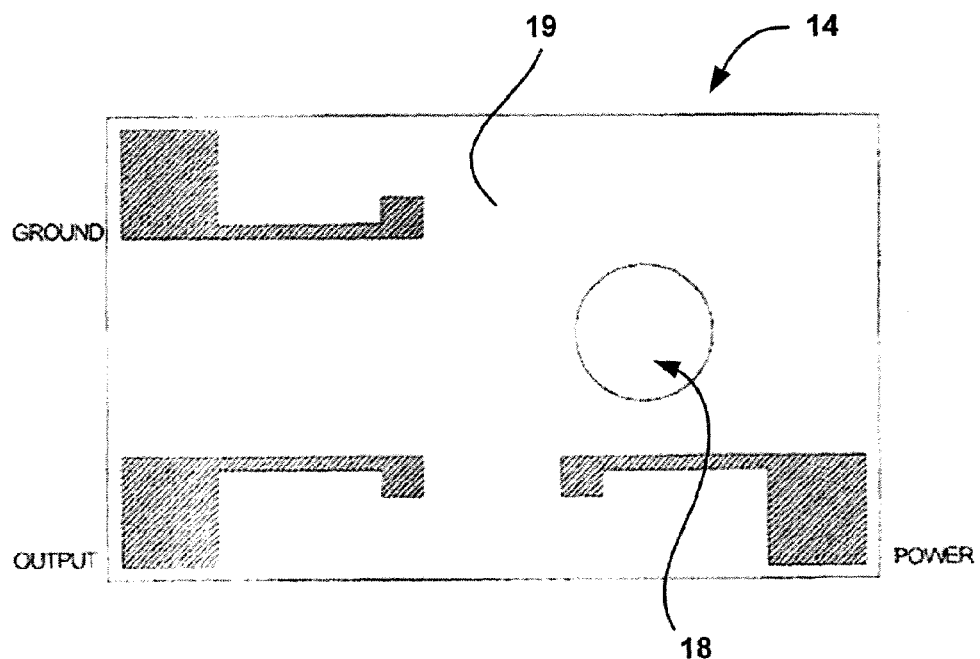
FIG. 6 is a plan view of a substrate to which a silicon condenser microphone is fixed.
Figure 7:
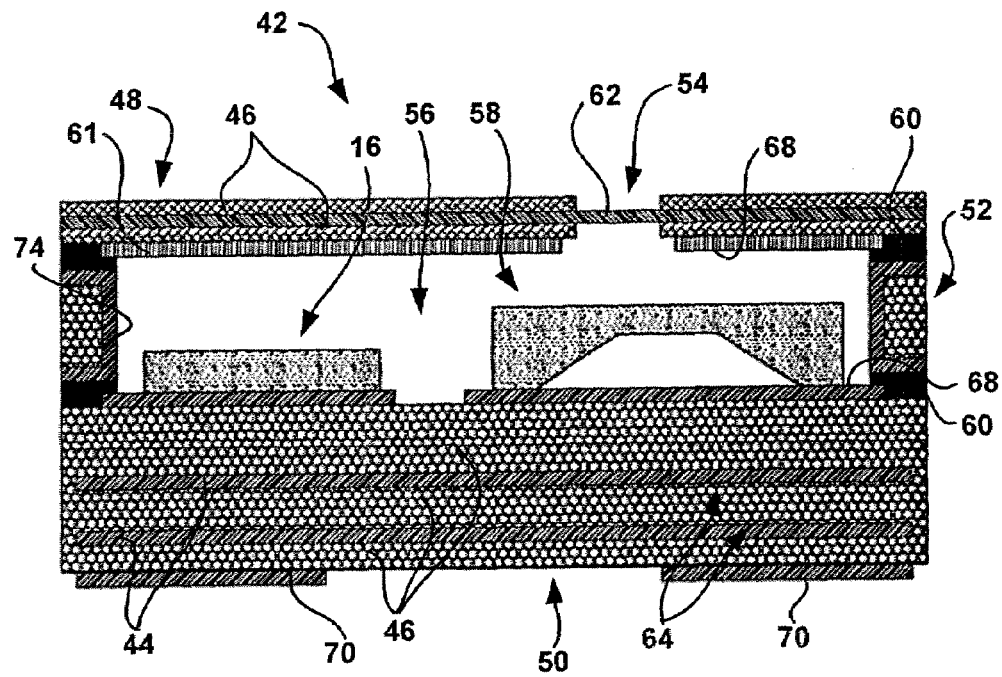
FIG. 7 is a longitudinal cross-sectional view of a microphone package of the present invention.
Figure 8:
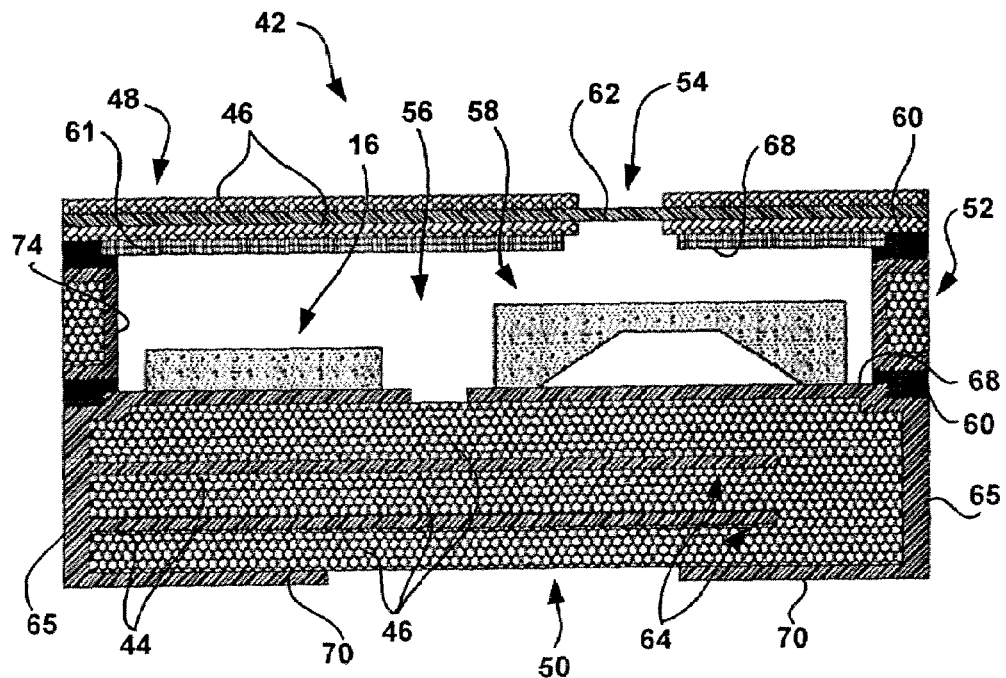
FIG. 8 is a lateral cross-sectional view of a microphone package of the present invention.
Figure 9:
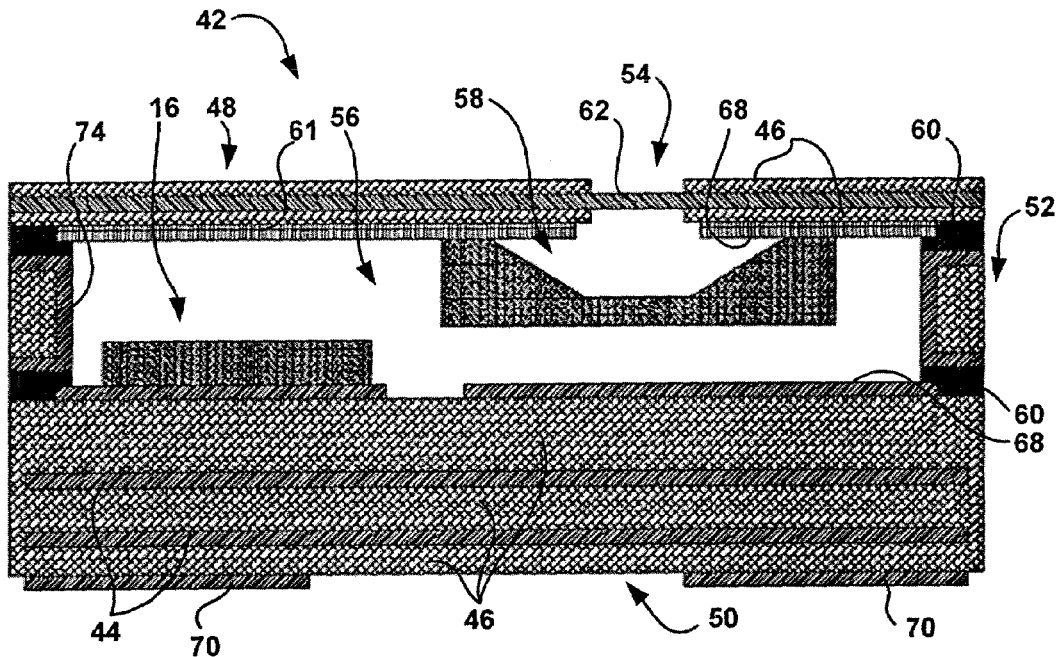
FIG. 9 longitudinal cross-sectional view of a microphone package of the present invention.
Figure 10:
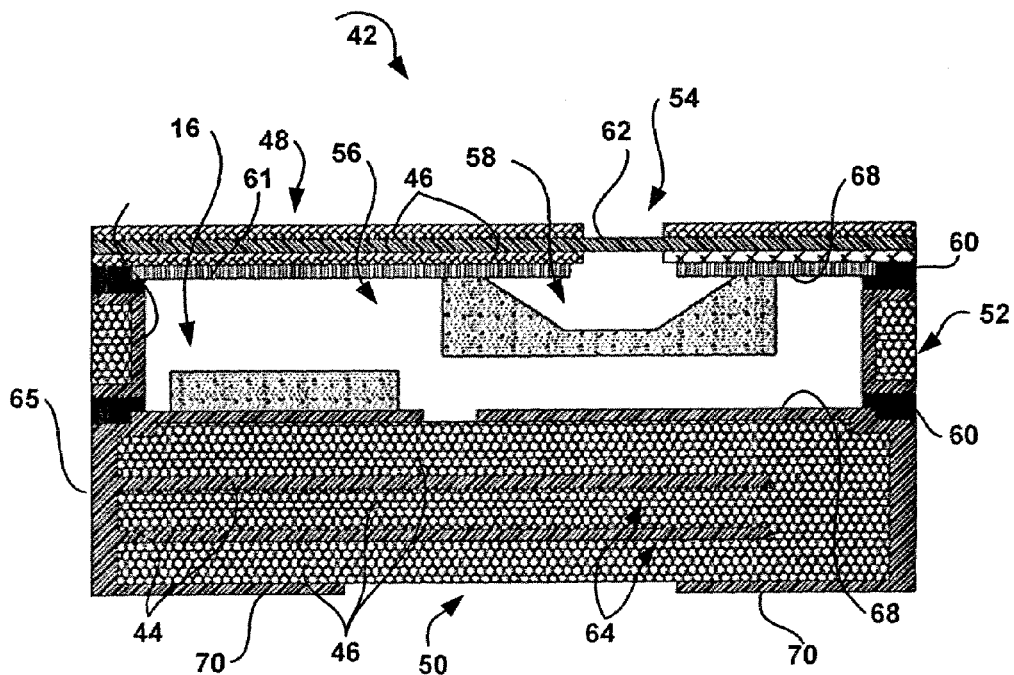
FIG. 10 is a lateral cross-sectional view of a microphone package of the present invention.

Now, referring to FIGS. 1-3, three embodiments of a silicon condenser microphone package 10 are illustrated. The silicon microphone package 10 generally comprises a transducer 12, e.g. a silicon condenser microphone as disclosed in U.S. Pat. No. 5,870,482 which is hereby incorporated by reference, a substrate 14, an amplifier 16, a back volume or air cavity 18 which provides a pressure reference for the transducer 12, and a cover 20. The substrate 14 is typically formed of FR-4 material which may be processed in circuit board panel form, thus taking advantage of economies of scale in manufacturing. FIG. 6 is a plan view of the substrate 14 showing the back volume 18 surrounded a plurality of terminal pads.

Figure 4:
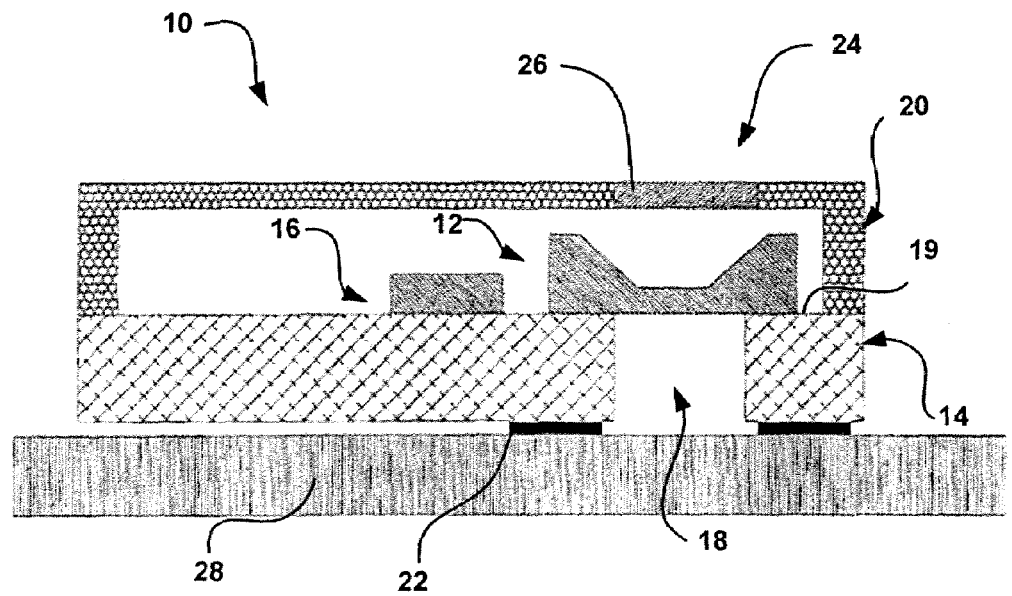
FIG. 4 is a cross-sectional view of the third embodiment of the present invention affixed to an end user circuit board.
Figure 5:
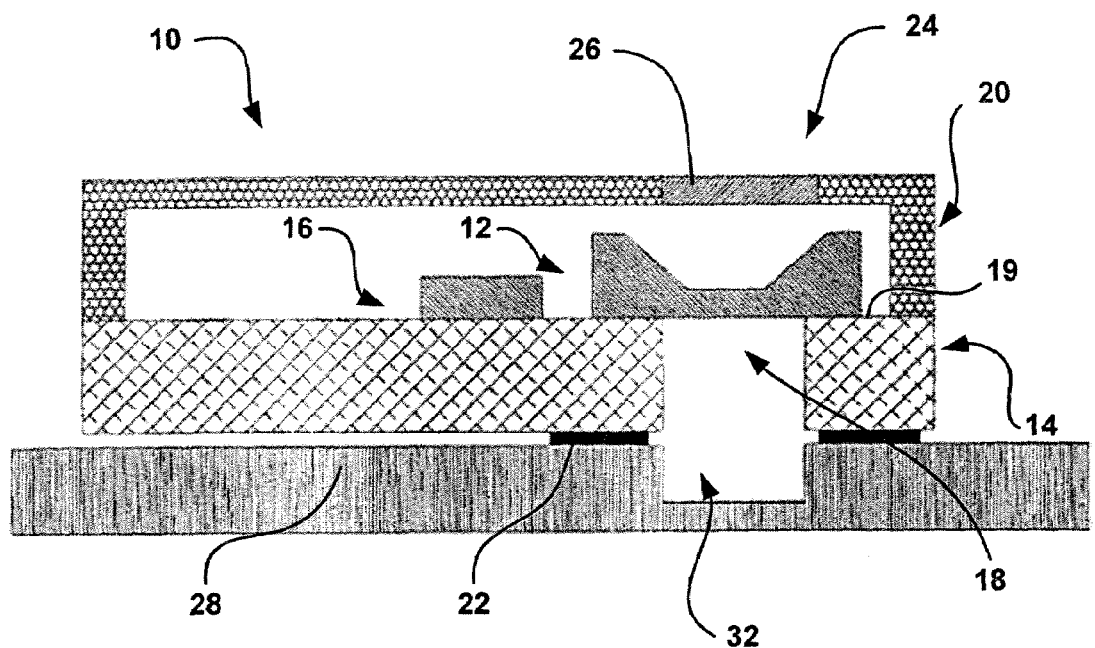
FIG. 5 is a cross-sectional view of the third embodiment of the present invention affixed to an end user circuit board in an alternate fashion.

The back volume 18 may be formed by a number of methods, including controlled depth drilling of an upper surface 19 of the substrate 14 to form a recess over which the silicon condenser microphone is mounted (FIG. 1); drilling and routing of several individual sheets of FR-4 and laminating the individual sheets to form the back volume 18 which may or may not have internal support posts (FIG. 2); or drilling completely through the substrate 14 and providing a sealing ring 22 on the bottom of the device that will seal the back volume 18 during surface mounting to a user's "board" 28 (FIGS. 3-5). In this example, the combination of the substrate and the user's board 28 creates the back volume 18. The back volume 18 is covered by the transducer 12 (MEMS device) which is "bumpbonded" and mounted face down. The boundary is sealed such that the back volume 18 is "air-tight".

The cover 20 is attached for protection and processibility. The cover 20 contains an aperture 24 which may contain a sintered metal insert 26 to prevent water, particles and/or light from entering the package and damaging the internal components inside; i.e. semiconductor chips. The aperture 24 is adapted for allowing sound waves to reach the transducer 12.

Referring to FIGS. 4 and 5, the final form of the product (shown without the cover 20) is a silicon condenser microphone package 10 which would most likely be attached to a end user's PCB 28 via a solder reflow process. FIG. 5 illustrates a method of enlarging the back volume 18 by including a chamber 32 within the end user's circuit board 28.

Another embodiment of a silicon condenser microphone package 40 is illustrated in FIGS. 7-10. In this embodiment, a housing 42 is formed from layers of materials, such as those used in providing circuit boards. Accordingly, the housing 42 generally comprises alternating layers of conductive and non-conductive materials 44, 46. The non-conductive layers 46 are typically FR-4 board. The conductive layers 44 are typically copper.

In the embodiment illustrated, the housing 42 includes a top portion 48 and a bottom portion 50 spaced by a side portion 52. The housing 42 further includes an aperture or acoustic port 54 for receiving an acoustic signal and an inner chamber 56 which is adapted for housing a transducer unit 58, typically a silicon die microphone or a ball grid array package (BGA). The top, bottom, and side portions 48, 50, 52 are electrically connected, for example with a conductive adhesive 60. Each portion may comprise alternating conductive and non-conductive layers of 44, 46.

The chamber 56 includes an inner lining 61. The inner lining 61 is primarily formed by conductive material. It should be understood that the inner lining may include portions of non-conductive material, as the conductive material may not fully cover the non-conductive material. The inner lining 61 protects the transducer 58 against electromagnetic interference and the like, much like a faraday cage.

In the various embodiments illustrated in FIGS. 7-10 and 23-26, the portions of the housing 42 that include the aperture or acoustic port 54 further include a layer of material that forms an environmental barrier 62 over or within the aperture 54. This environmental barrier 62 is typically a polymeric material formed to a film, such as a polytetrafluoroethylene (PTFE) or a sintered metal. The environmental barrier 62 is supplied for protecting the chamber 56 of the housing 42, consequently, the transducer unit 58 within the housing 42, from environmental elements such as sunlight, moisture, oil, dirt, and/or dust.

The environmental barrier layer 62 is generally sealed between two layers of conductive material 44. When the environmental barrier layer 62 is sandwiched between two layers of conductive material 44, it may act as a capacitor (with electrodes defined by the metal) that can be used to filter input and output signals or the input power. The environmental barrier layer 62 may further serve as a dielectric protective layer when in contact with the conductive layers 44 in the event that the conductive layers also contain thin film passive devices such as resistors and capacitors.

In addition to protecting the chamber 56 from environmental elements, the barrier layer 62 allows subsequent wet processing, board washing of the external portions of the housing 42, and electrical connection to ground from the walls via thru hole plating. The environmental barrier layer 62 also allows the order of manufacturing steps in the fabrication of the printed circuit board-based package to be modified. This advantage can be used to accommodate different termination styles. For example, a double sided package can be fabricated having a pair of apertures 54 (see FIG. 25), both including an environmental barrier layer 62. The package would look and act the same whether it is mounted face up or face down, or the package could be mounted to provide directional microphone characteristics.

Figure 11:
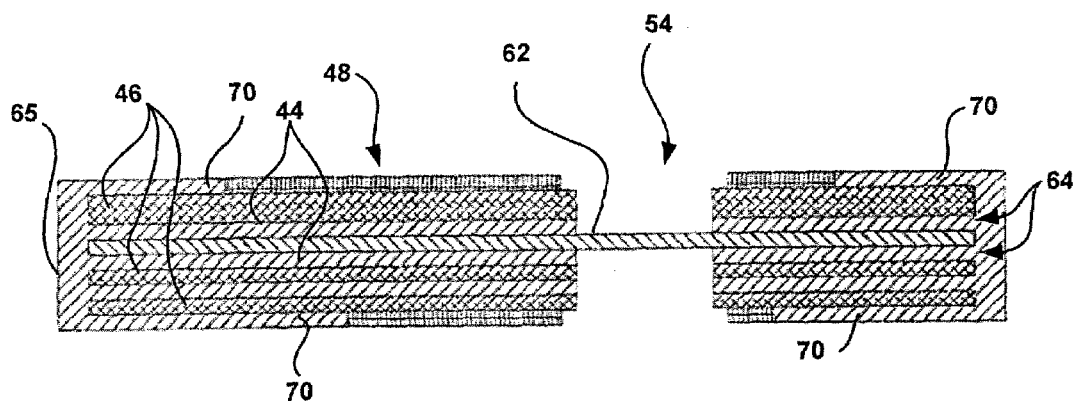
FIG. 11 is a cross-sectional view of a top portion for a microphone package of the present invention.
Figure 12:
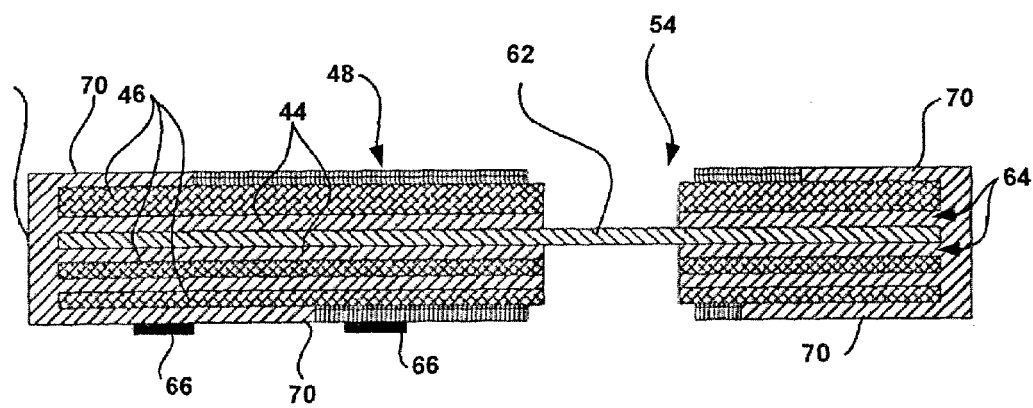
FIG. 12 is a cross-sectional view of a top portion for a microphone package of the present invention.
Figure 13:
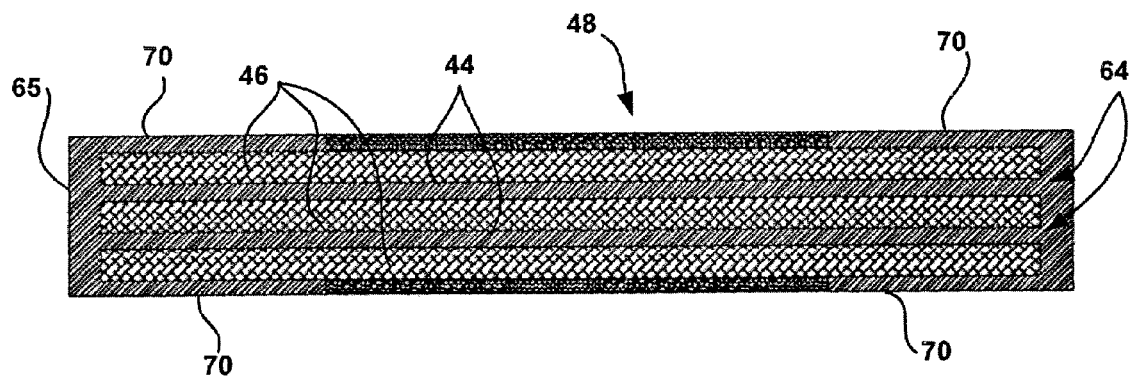
FIG. 13 is a cross-sectional view of a top portion for a microphone package of the present invention.

Referring to FIGS. 7, 8, and 11-13, the transducer unit 58 is generally not mounted to the top portion 48 of the housing. This definition is independent of the final mounting orientation to an end user's circuit board. It is possible for the top portion 48 to be mounted face down depending on the orientation of the transducer 58 as well as the choice for the bottom portion 50. The conductive layers 44 of the top portion 48 may be patterned to form circuitry, ground planes, solder pads, ground pads, and plated through hole pads. Referring to FIGS. 11-13, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

FIG. 11 illustrates an alternative top portion 48 for a microphone package. In this embodiment, a connection between the layers can be formed to provide a conduit to ground. The top portion of FIG. 11 includes ground planes and/or pattern circuitry 64 and the environmental barrier 62. The ground planes and or pattern circuitry 64 are connected by pins 65.

FIG. 12 illustrates another embodiment of a top portion 48. In addition to the connection between layers, ground planes/pattern circuitry 64, and the environmental barrier 62, this embodiment includes conductive bumps 66 (e.g. Pb/Sn or Ni/Au) patterned on the bottom side to allow secondary electrical contact to the transducer 58. Here, conductive circuitry would be patterned such that electrical connection between the bumps 66 and a plated through hole termination is made.

FIG. 13 illustrates yet another embodiment of the top portion 48. In this embodiment, the top portion 48 does not include an aperture or acoustic port 54.

Referring to FIGS. 7, 8 and 14-18, the bottom portion 50 is the component of the package to which the transducer 58 is primarily mounted. This definition is independent of the final mounting orientation to the end user's circuit board. It is possible for the bottom portion 50 to be mounted facing upwardly depending on the mounting orientation of the transducer 58 as well as the choice for the top portion 48 construction. Like the top portion 48, the conductive layers 44 of the bottom portion 50 may be patterned to form circuitry, ground planes, solder pads, ground pads and plated through hole pads. As shown in FIGS. 14-18, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

Figure 14A:
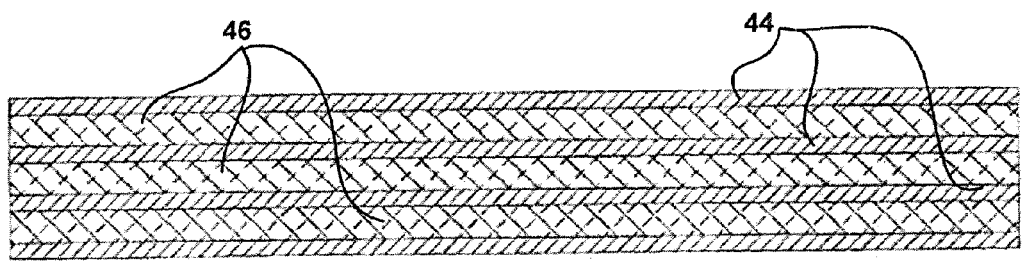
FIG. 14a is a cross-sectional view of a laminated bottom portion of a housing for a microphone package of the present invention.
Figure 14B:
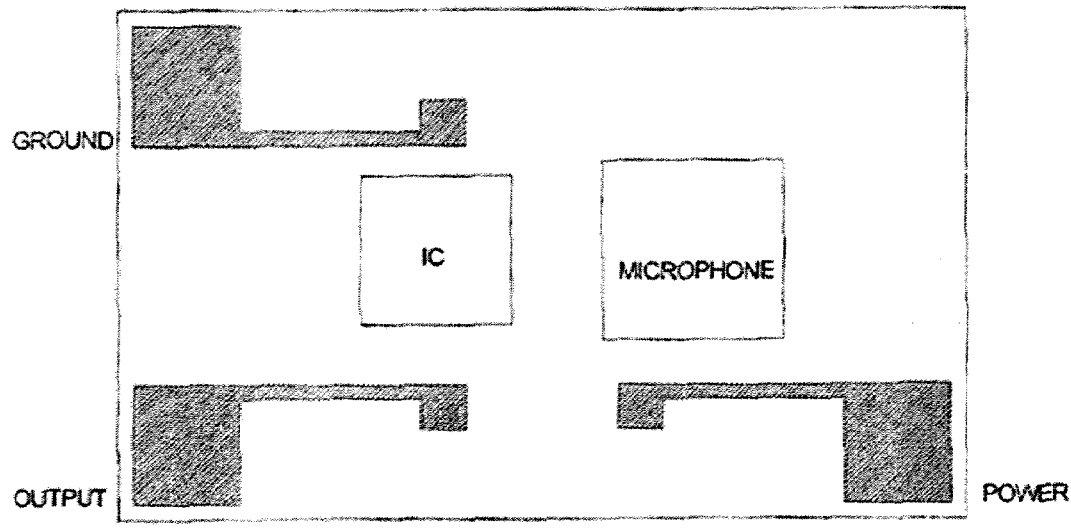

Referring to FIGS. 14a through 14d, the bottom portion 50 comprises a laminated, multi-layered board including layers of conductive material 44 deposited on layers of non-conductive material 46. Referring to FIG. 14b, the first layer of conductive material is used to attach wire bonds or flip chip bonds. This layer includes etched portions to define lead pads, bond pads, and ground pads. The pads would have holes drilled through them to allow the formation of plated through-holes.

Figure 14C:
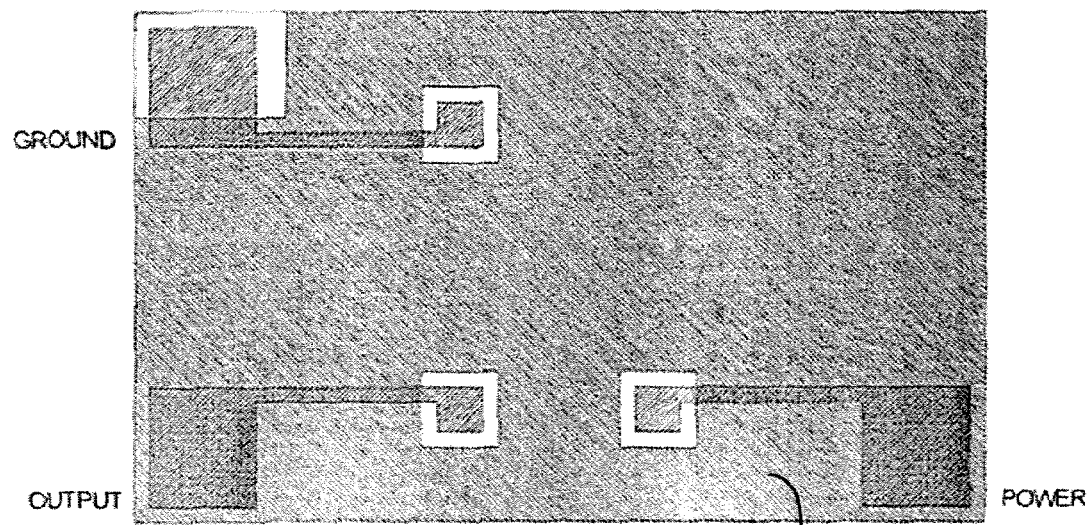

As shown in FIG. 14c, a dry film 68 of non-conductive material covers the conductive material. This illustration shows the exposed bonding pads as well as an exposed ground pad. The exposed ground pad would come in electrical contact with the conductive epoxy and form the connection to ground of the side portion 52 and the base portion 50.

Figure 14D:
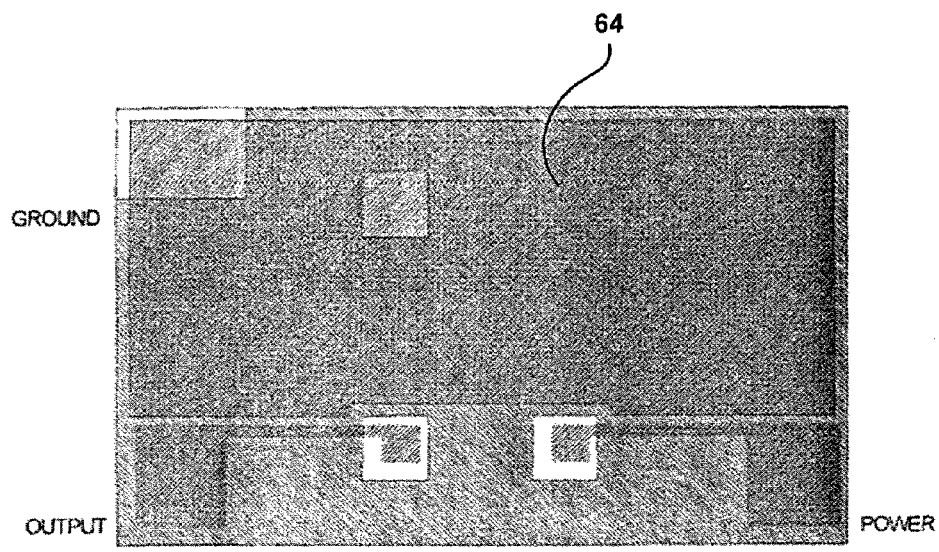

Referring to FIG. 14d, ground layers can be embedded within the base portion 50. The hatched area represents a typical ground plane 64. The ground planes do not overlap the power or output pads, but will overlap the transducer 58.

Figure 15:
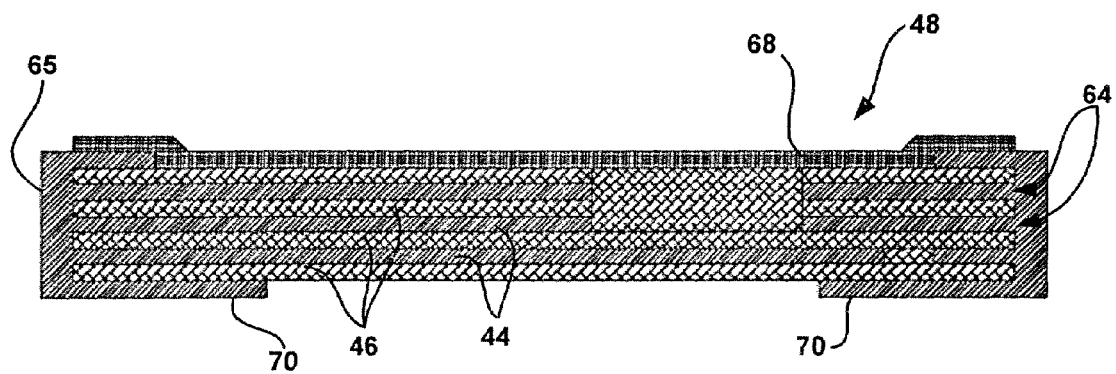
FIG. 15 is a cross-sectional view of a bottom portion for a microphone package of the present invention.

Referring to FIG. 15, an embodiment of the bottom portion 50 is illustrated. The bottom portion 50 of this embodiment includes a solder mask layer 68 and alternating layers of conductive and non-conductive material 44, 46. The bottom portion further comprises solder pads 70 for electrical connection to an end user's board.

Figure 16:
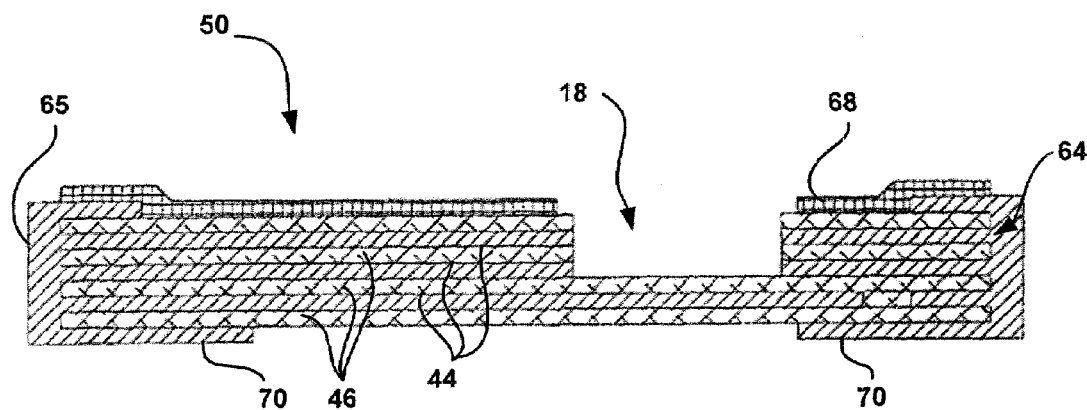
FIG. 16 is a cross-sectional view of a bottom portion for a microphone package of the present invention.
Figure 17:
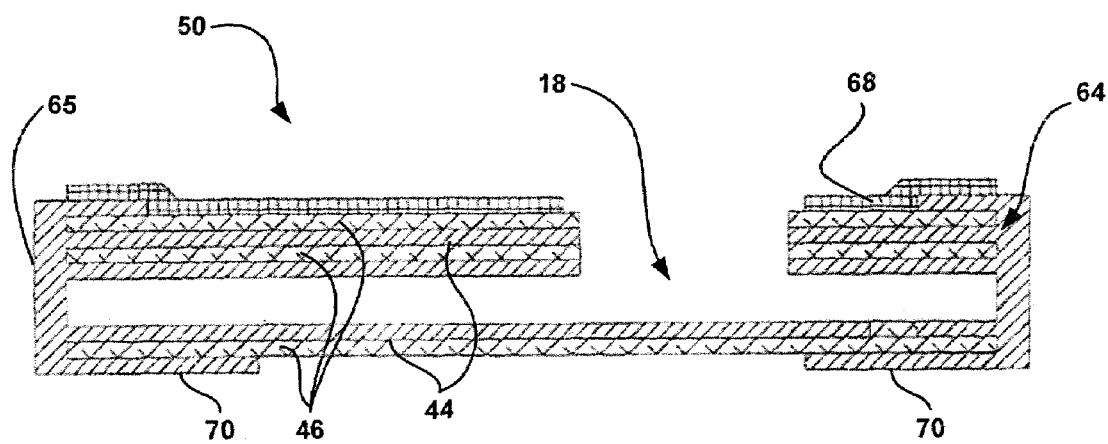
FIG. 17 is a cross-sectional view of a bottom portion for a microphone package of the present invention.

FIGS. 16 and 17 illustrate embodiments of the bottom portion 50 with enlarged back volumes 18. These embodiments illustrate formation of the back volume 18 using the conductive/non-conductive layering.

Figure 18:
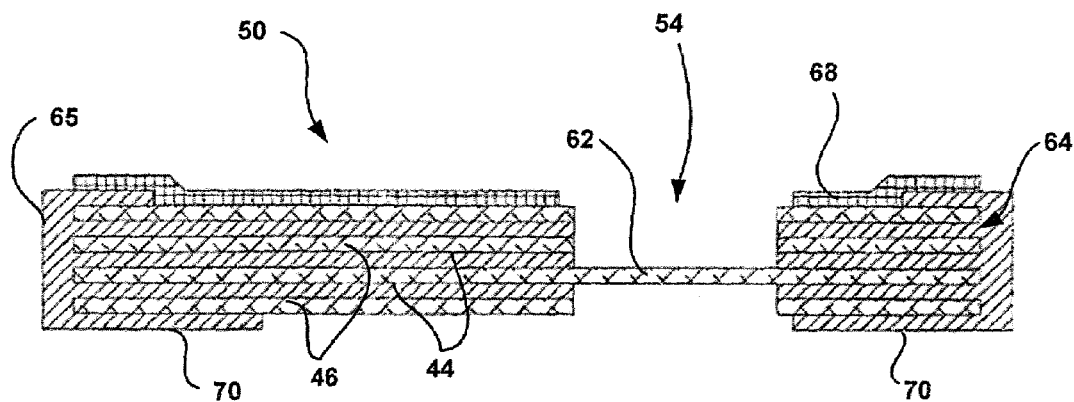
FIG. 18 is a cross-sectional view of a bottom portion for a microphone package of the present invention.

FIG. 18 shows yet another embodiment of the bottom portion 50. In this embodiment, the back portion 50 includes the acoustic port 54 and the environmental barrier 62.

Referring to FIGS. 7-10 and 19-22, the side portion 52 is the component of the package that joins the bottom portion 50 and the top portion 48. The side portion 51 may include a single layer of a non-conductive material 46 sandwiched between two layers of conducive material 44. The side portion 48 forms the internal height of the chamber 56 that houses the transducer 58. The side portion 52 is generally formed by one or more layers of circuit board material, each having a routed window 72 (see FIG. 18).

Figure 19:
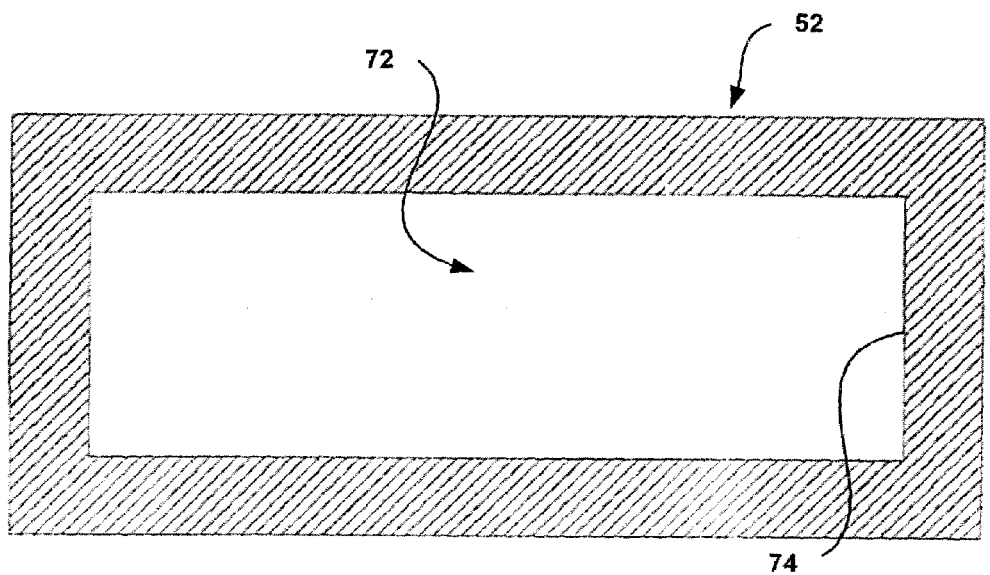
FIG. 19 is a plan view of a side portion for a microphone package of the present invention.
Figure 20:
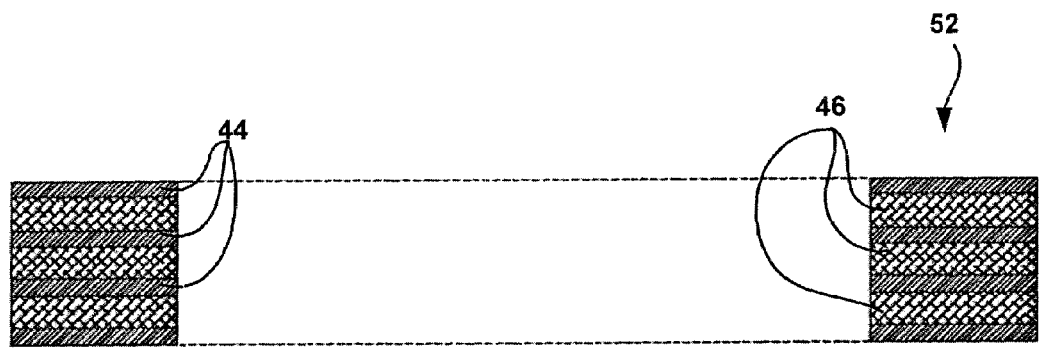
FIG. 20 is a cross-sectional package view of a side portion for a microphone package of the present invention.
Figure 21:
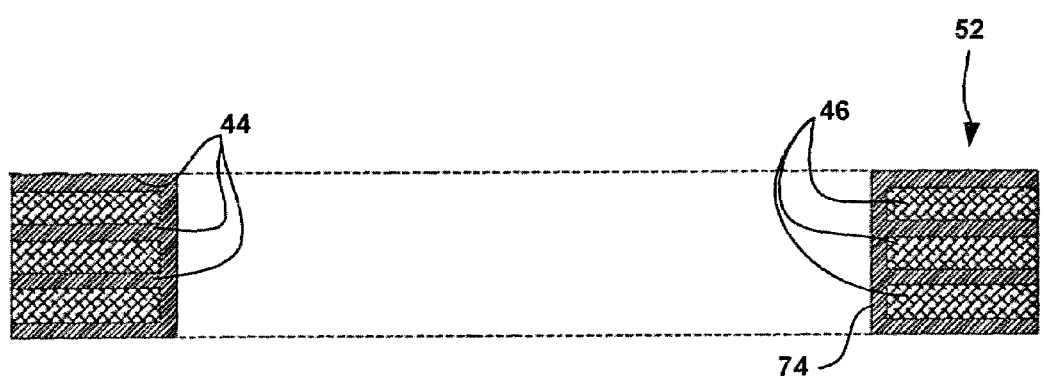
FIG. 21 is a cross-sectional view of a side portion for a microphone package of the present invention.
Figure 22:
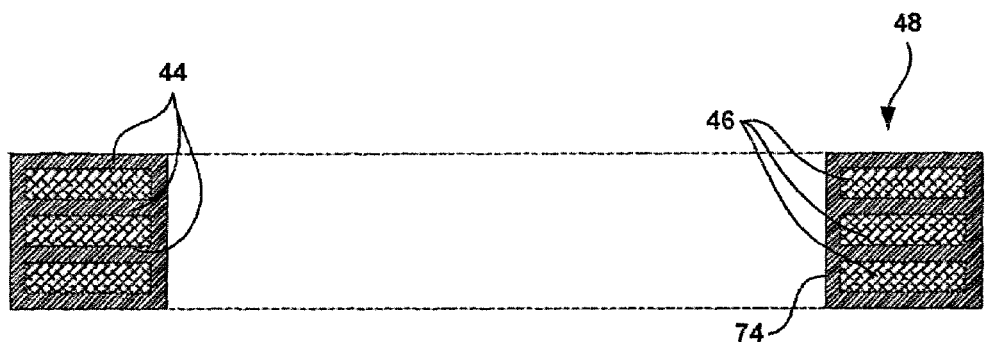
FIG. 22 is a cross-sectional view of a side portion for a microphone package of the present invention.

Referring to FIGS. 19-22, the side portion 52 includes inner side wall 74. The inner side walls 74 are generally plated with a conductive material, typically copper, as shown in FIGS. 20 and 21. The side wall 74 are formed by the outer perimeter of me routed window 72 and coated/metallized with a conductive material.

Alternatively, the side wall 74 may be formed by many alternating layers of non-conductive material 46 and conductive material 44, each having a routed window 72 (see FIG. 19). In this case, the outer perimeter of the window 72 may not require coverage with a conductive material because the layers of conductive material 44 would provide effective shielding.

FIGS. 23-26 illustrate various embodiments of the microphone package 40. These embodiments utilize top, bottom, and side portions 48, 50, and 52 which are described above. It is contemplated that each of the top, bottom, and side portion 48, 50, 52 embodiments described above can be utilized in any combination without departing from the invention disclosed and described herein.

Figure 23:
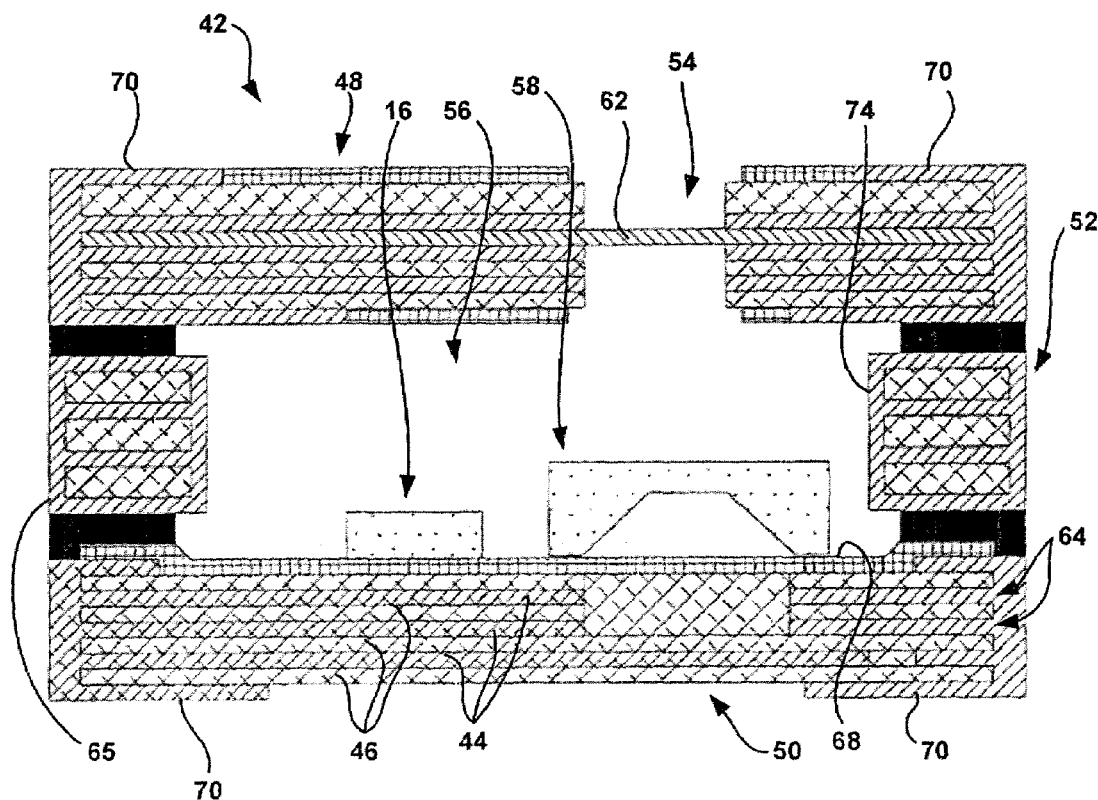
FIG. 23 is a cross-sectional view of a microphone package of the present invention.

In FIG. 23, connection to an end user's board is made through the bottom portion 50. The package mounting orientation is bottom portion 50 down connection from the transducer 58 to the plated through holes is be made by wire bonding. The transducer back volume 18 is formed by the back hole (mounted down) of the silicon microphone only. Bond pads, wire bonds and traces to the terminals are not shown. A person of ordinary skilled in the art of PCB design will understand that the traces reside on the first conductor layer 44. The wire bonds from the transducer 58 are be connected to exposed pads. The pads are connected to the solder pads via plated through holes and traces on the surface.

Figure 24:
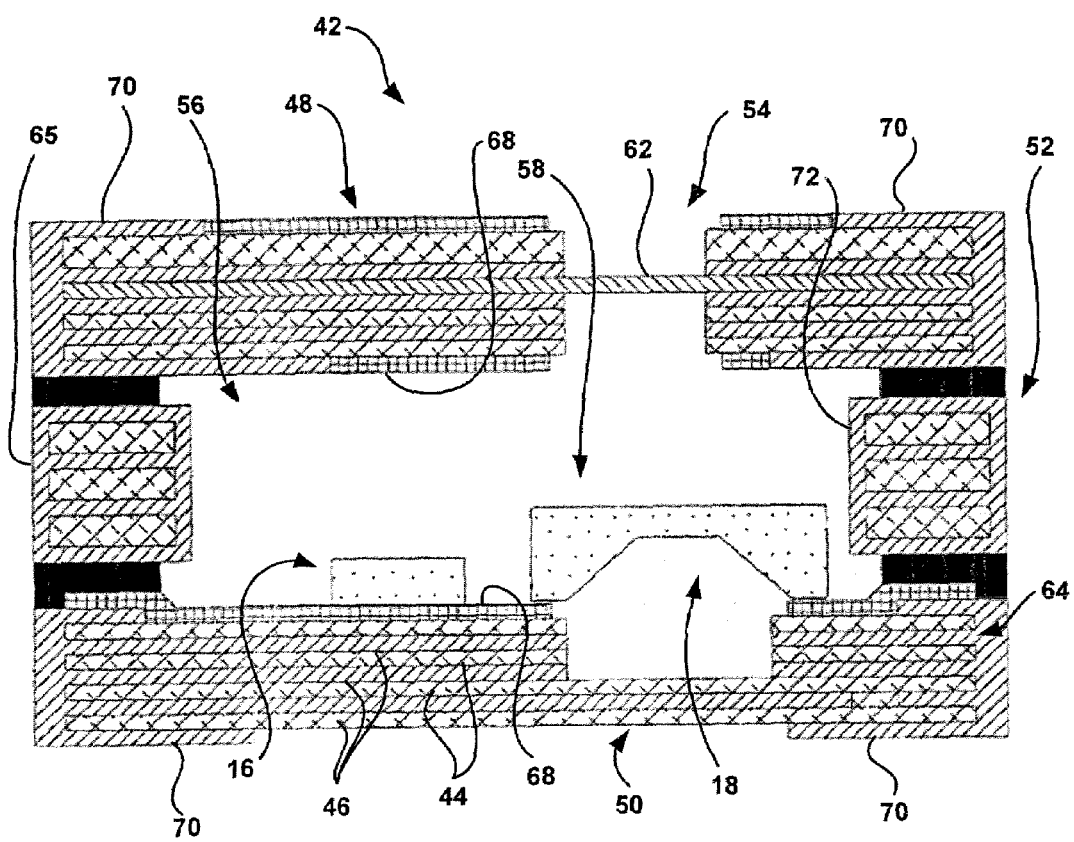
FIG. 24 is a cross-sectional view of a microphone package of the present invention.

In FIG. 24, connection to the end user's board is also made through the bottom portion 50. Again, the package mounting orientation is bottom portion 50 connection from the transducer 58 to the plated through holes are made by wire bonding. The back volume 18 is formed by a combination of the back hole of the transducer 58 (mounted down) and the bottom portion 50.

Figure 25:
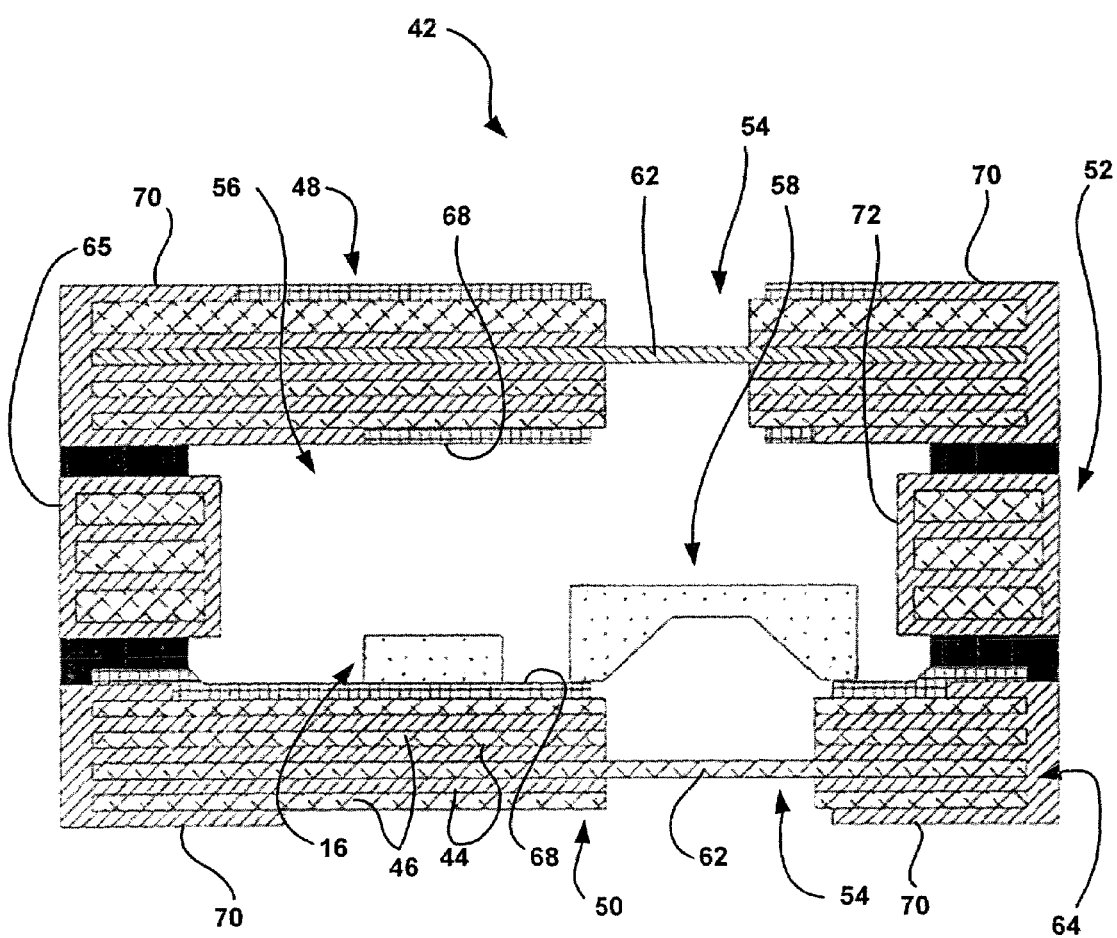
FIG. 25 is across-sectional view of a microphone package of the present invention.

In FIG. 25, connection to the end user's board is also made through the bottom portion 50. Again, the package mounting orientation is bottom portion 50 connection from the transducer 58 to the plated through holes are made by wire bonding. With acoustic ports 54 on both sides of the package, there is no back volume, This method is suitable to a directional microphone.

Figure 26:
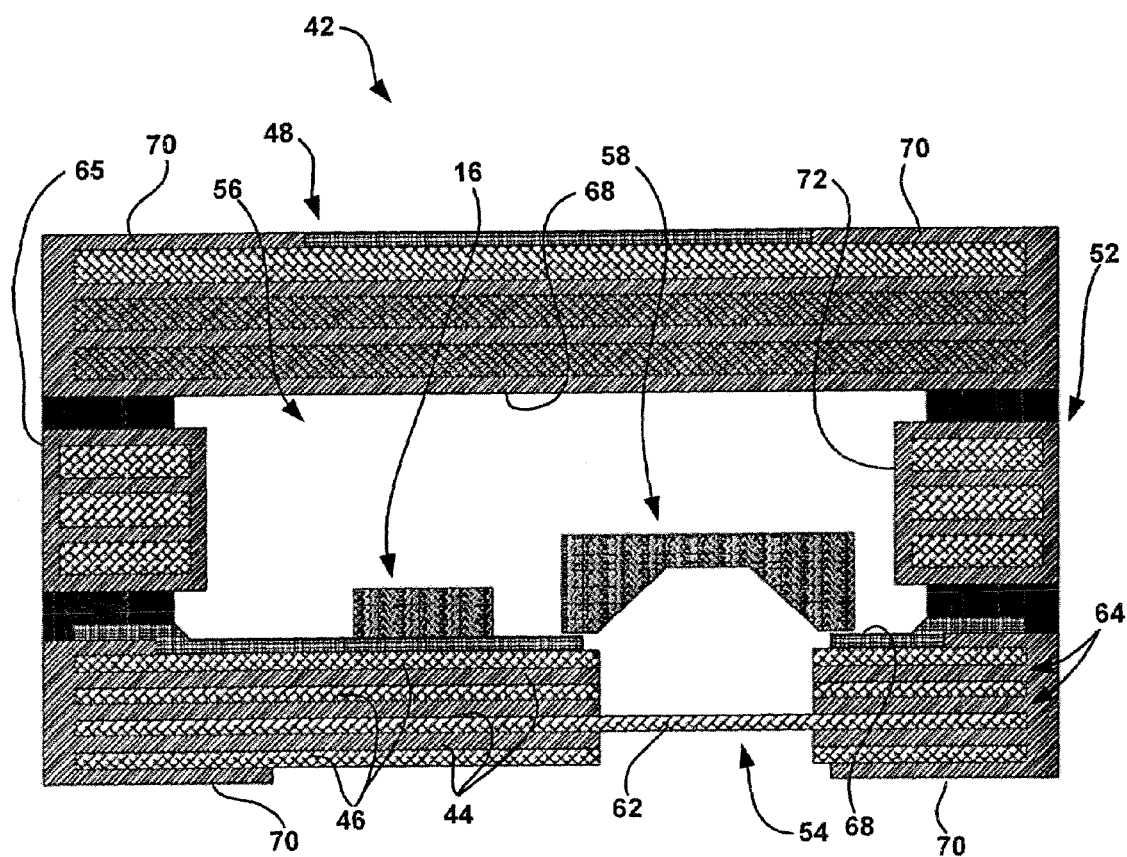
FIG. 26 is a cross-sectional view of a microphone package of the present invention.

In FIG. 26, connection to the end user's board is made through the top portion 48 of the bottom portion 50. The package mounting orientation is either top portion 48 down or bottom portion 50 down. Connection from the transducer 58 to the plated through holes is made by flip chipping and trace routing. The back volume 18 is formed by using the air cavity created by laminating the bottom portion 50 and the top portion 48 together. Some portion of the package fabrication is performed after the transducer 58 has been attached. In particular, the through hole formation, plating, and solder pad definition would be done after the transducer 58 is attached. The protective membrane 62 is hydrophobic and prevents corrosive plating chemistry from entering the chamber 56.

Figure 27:
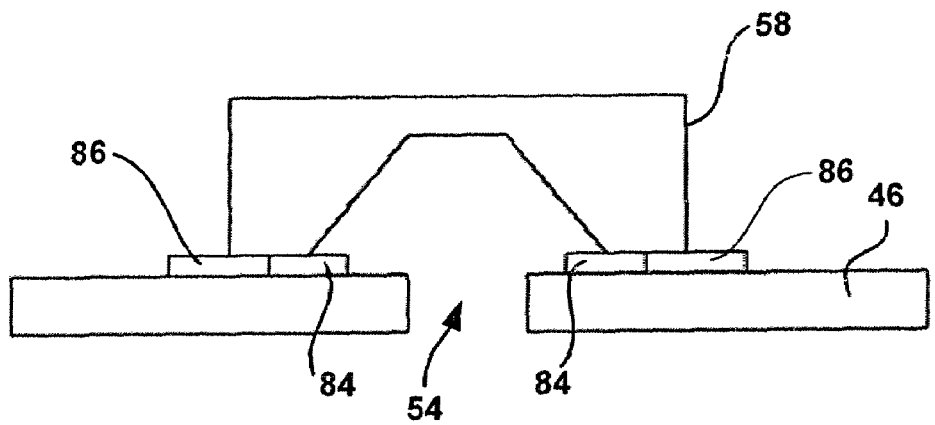
FIG. 27 is a cross-sectional view of a microphone package of the present invention with a retaining ring.
Figure 28:
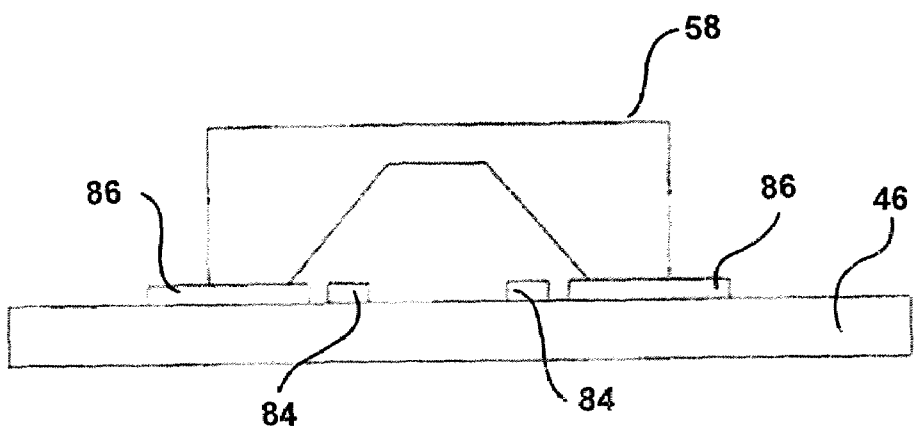
FIG. 28 is a cross-sectional view of a microphone package of the present invention with a retaining wing.
Figure 29:
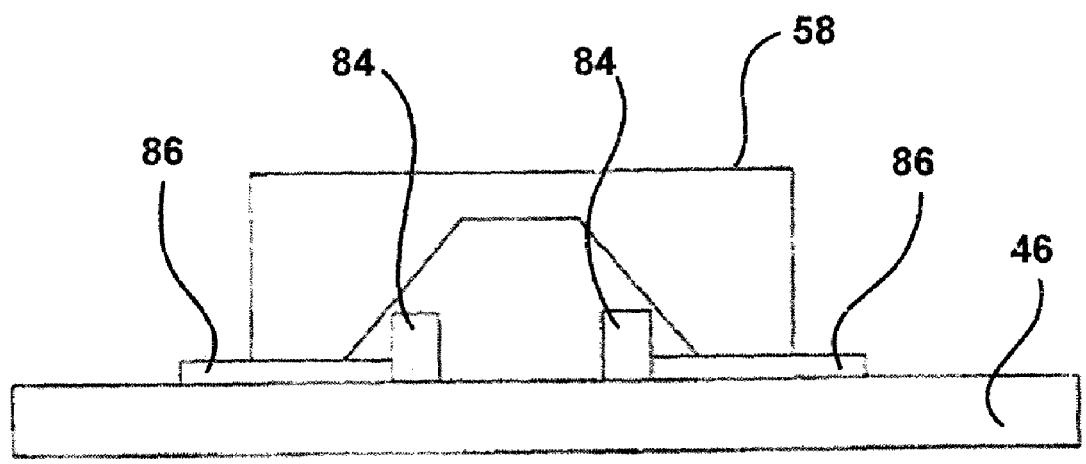
FIG. 29 is a cross-sectional view of a microphone package of the present invention with a retaining ring.

Referring to FIGS. 27-29, the portion to which the transducer unit 58 is mounted may include a retaining ring 84. The retaining ring 84 prevents wicking of an epoxy 86 into the transducer 58 and from flowing into the acoustic port or aperture 54. Accordingly, the shape of the retaining ring 84 will typically match the shape of the transducer 58 foot print. The retaining ring 84 comprises a conductive material (e.g., 3 mil. thick copper) imaged on a non-conductive layer material.

Referring to FIG. 27, the retaining ring 84 is imaged onto a non-conductive layer. An epoxy is applied outside the perimeter of the retaining ring 84, and the transducer 58 is added so that it overlaps the epoxy 86 and the retaining ring 84. This reduces epoxy 86 wicking up the sides of the transducer's 58 etched port (in the case of a silicon die microphone).

Alternatively, referring to FIG. 28, the retaining ring 84 can be located so that the transducer 58 does not contact the retaining ring 84. In this embodiment, the retaining ring 84 is slightly smaller than the foot print of the transducer 58 so that the epoxy 86 has a restricted path and is, thus, less likely to wick. In FIG. 29, the retaining ring 84 is fabricated so that it contacts the etched port of the transducer 58.

The following tables provide an illustrative example of a typical circuit board processing technique for fabrication of the housing of this embodiment.

TABLE 1

| Materials | | | |
|---|---|---|---|
| Material | Type | Component | Note |
| 1 | 0.5/0.5 oz. DST Cu 5 core FR-4 | Bottom Portion (Conductive Layers 1 and 2; Non-Conductive Layer 1) | |
| 2 | 0.5/0.5 oz. DST Cu 5 core FR-4 | Bottom Portion (Conductive Layers 3 and 4; Non-Conductive Layer 2) | |
| 3 | 106 pre-preg | | For Laminating Material 1 and Material 2 |
| 4 | 0.5/0.5 oz. DST Cu 40 Core FR-4 | Side Portion | Metallized Afterward |
| 5 | Bare/0.5 oz. Cu 2 core FR-4 (2 pieces) | Top Portion (Each Piece Includes 1 Conductive and 1 Non-Conductive Layer) | |
| 6 | Expanded PTFE | Environmental Barrier | |

TABLE 2

| Processing of Materials (Base Portion Material 1) | | | |
|---|---|---|---|
| Step | Type | Description | Note |
| 1 | Dry Film Conductive Layers | | |
| 2 | Expose | Mask Material 1 (Lower Conductive Layer) | Forms Ground Plane on Lower Conductive Layer |
| 3 | Develop | | |
| 4 | Etch Cu | | No Etching on Upper Conductive Layer |
| 5 | Strip Dry Film | | |

TABLE 3

| Processing of Materials (Bottom Portion Material 2) | | | |
|---|---|---|---|
| Step | Type | Description | Note |
| 1 | Dry Film Conductive Layers | | |
| 2 | Expose | Mask Material 2 (Upper Conductive Layer) | Forms Ground Plane on Upper Conductive Layer |
| 3 | Develop | | |
| 4 | Etch Cu | | No Etching on Lower Conductive Layer |
| 5 | Strip Dry Film | | |

TABLE 4

| Processing of Materials 1, 2, and 3 (Form Bottom Portion) | | | |
|---|---|---|---|
| Step | Type | Description | Note |
| 1 | Laminate | Materials 1 and 2 Laminated Using Material 3 | |
| 2 | Drill Thru Holes | Drill Bit = 0.025 in. | |
| 3 | Direct Metallization/Flash Copper | Plates Thru Holes | |
| 4 | Dry Film (L1 and L4) | | |
| 5 | Expose | Mask Laminated Materials 1 and 2 (Upper and Lower Conductive Layers) | Forms Traces and Solder Pads |
| 6 | Develop | | |
| 7 | Electrolytic Cu | 1.0 mil | |
| 8 | Electrolytic Sn | As Required | |
| 9 | Strip Dry Film | | |
| 10 | Etch Cu | | |
| 11 | Etch Sn | | |
| 12 | Insert Finishing Option Here | NG Option (See Table Below) | NG Option for Proof of Principle |
| 13 | Dry Film (cover lay) on Upper Conductive Layer Only | 2.5 mil | Minimum Thickness on Upper Conductive Layer |
| 14 | Expose | Mask Laminated Materials 1 and 2 (upper and lower) | This mask defines an area on the upper conductive layer that will receive a dry film solder mask (cover lay). The |

TABLE 4-continued

Processing of Materials 1, 2, and 3 (Form Bottom Portion)

| Step | Type | Description | Note |
|---|---|---|---|
|  |  |  | bottom layer will not have dry film applied to it. The plated through holes will be bridged over by the coating on the top. |
| 15 | Develop |  |  |
| 16 | Cure |  | Full Cure |
| 17 | Route Panels | Route Bit = As Required | Forms 4" × 4" pieces. Conforms to finished dims |

Table 5 describes the formation of the side portion 52. This process involves routing a matrix of openings in FR-4 board. However, punching is thought to be the cost effective method for manufacturing. The punching may done by punching through the entire core, or, alternatively, punching several layers of no-flow pre-preg and thin core c-stage which are then laminated to form the wall of proper thickness.

After routing the matrix, the board will have to be electroless or DM plated. Finally, the boards will have to be routed to match the bottom portion. This step can be done first or last. It may make the piece more workable to perform the final routing as a first step.

TABLE 5

Processing of Material 4 (Side Portion)

| Step | Type | Description | Note |
|---|---|---|---|
| 1 | Route./Punch Matric of Openings | Route Bit = 0.031 in. | Forms Side Portion |
| 2 | Direct Metallization/ Flash Cu | 0.25 mil minimum | Forms Sidewalls on Side Portion |
| 3 | Route Panels |  |  |

Table 6 describes the processing of the top portion. The formation of the top portion 48 involves imaging a dry film cover layer or liquid solder mask on the bottom (i.e. conductive layer forming the inner layer. The exposed layer of the top portion 48 will not have a copper coating. It can be processed this way through etching or purchased this way as a one sided laminate.

A matrix of holes is drilled into the lid board. Drilling may occur after the imaging step. If so, then a suitable solder mask must be chosen that can survive the drilling process.

TABLE 6

Processing of Top Portion

| Step | Type | Description | Note |
|---|---|---|---|
| 1 | Dry Film | Conductive Layer |  |
| 2 | Expose | Mask Bare Layer | Form Conduction Ring |
| 3 | Develop |  |  |
| 4 | Cure |  |  |
| 5 | Drill Matrix of Holes | Drill Bit = 0.025 in. | Acoustic Ports |
| 6 | Laminate | PTFE (Environmental Barrier) Between 2 Pieces of Material 5 | Forms Top Portion |

TABLE 7

Processing of Laminated Materials 1 and 2 with Material 4

| Step | Type | Description | Note |
|---|---|---|---|
| 1 | Screen Conductive Adhesive on Material 4 |  |  |
| 2 | Laminate | Bottom Portion with Side Portion | Forms Bottom Portion with Side Portion (spacer) |
| 3 | Add Transducer Assembly | Silicon Die Microphone and Integrated Circuit |  |

TABLE 8

Processing of Laminated Materials 1, 2, and 4 with Material 5

| Step | Type | Description | Note |
|---|---|---|---|
| 1 | Screen Conductive Adhesive on Top Portion |  |  |
| 2 | Laminate | Bottom Portion and Side Portion with Top_Portion | Forms Housing |
| 3 | Dice |  |  |

TABLE 9

Finishing Option NG (Nickel/Gold)

| Step | Type | Description | Note |
|---|---|---|---|
| 1 | Immersion Ni (40-50, μ-in) |  |  |
| 2 | Immersion Au (25-30, μ-in) |  |  |

TABLE 10

Finishing Option NGT (Nickel/Gold/Tin)

| Step | Type |
|---|---|
| 1 | Mask L2 (using thick dry film or high tack dicing tape) |
| 2 | Immersion Ni (40-50, μ-in) |
| 3 | Immersion Au (25-30, μ-in) |
| 4 | Remove Mask on L2 |
| 5 | Mask L1 (using thick dry film or high tack dicing tape) bridge over cavity created by wall |
| 6 | Immersion Sn (100-250, μ-in) |
| 7 | Remove Mask on L1 |

TABLE 11

Finishing Option ST (Silver/Tin)

| Step | Type |
|---|---|
| 1 | Mask L2 (using thick dry film or high tack dicing tape) |
| 2 | Immersion Ag (40-50 μ-in) |
| 3 | Remove Mask on L2 |
| 4 | Mask L1 (using thick dry film or high tack dicing tape) bridge over cavity created by wall |
| 5 | Immersion Sri (100-250 μ-in) |
| 6 | Remove Mask on L1 |

While specific embodiments have been illustrated and described, numerous modifications come to mind without significantly departing from the spirit of the invention, and the scope of protection is only limited by the scope of the accompanying claims.

What is claimed is:

1. A method for producing a MEMS transducer, the method comprising:
providing a substrate, the substrate comprising a first insulating layer, a first conductive layer, and an aperture;
coupling a transducer to the substrate overlapping the aperture to form at least a portion of a cavity for the transducer;
providing and attaching a cover to the substrate to enclose and protect the transducer, the cover comprising a second insulating layer and a second conductive layer; and
joining the first conductive layer and the second conductive layer to form a shield against electromagnetic interference.

2. The method of claim 1, wherein the cavity comprises a back volume or an acoustic port.

3. The method of claim 2, wherein one of the first conductive layer and the second conductive layer comprises lead pads electrically coupled to the transducer.

4. The method of claim 2, wherein one of the first conductive layer and the second conductive layer comprises an electrical ground plane coupled to at least one of the lead pads.

5. The method of claim 1, providing a sealing ring, the sealing ring being attached to the substrate adjacent the cavity.

6. A method for producing a MEMS transducer, the method comprising:
providing a substrate;
providing and coupling a transducer to the substrate;
providing and joining a cover to the substrate to form a housing, the housing defining an interior portion in which the transducer is disposed; and
forming an aperture within the housing acoustically coupling the interior portion to an exterior portion of the housing for receiving a signal; and
electrically shielding the transducer by associating with the housing an inner lining on a surface of the inner portion, the inner lining being a conductive material such that the conductive material provides an effective shield against electromagnetic interference.

7. The method of claim 6, comprising providing a spacer member formed as a portion of the housing.

8. The method of claim 7, wherein the surface comprises a portion of each of the cover and the spacer and electrically shielding the transducer comprises electrically coupling portions of the inner lining disposed on the surface portions of the cover and the spacer.

9. The method of claim 6, wherein the inner lining comprises one or more conductive layers formed within the housing.

10. The method of claim 6, providing an environmental barrier, the environmental baffler being disposed within the aperture.

11. The method of claim 10, the environmental barrier comprising a nonconductive material.

12. The method of claim 6, wherein providing the aperture comprises providing the aperture in the cover or the substrate or both the cover and the substrate.

13. The method of claim 6, further comprising:
forming a recess within the interior portion; and
coupling the transducer to the recess to form a cavity.

14. The method of claim 13, wherein the cavity comprises a back volume or an acoustic port.

15. The method of claim 6, further comprising:
forming a passage through the housing; and
coupling the transducer to the passage to form at least a portion of a cavity.

16. The method of claim 15, wherein the cavity comprises a back volume or an acoustic port.

17. The method of claim 6, the substrate comprises at least one layer of a conductive material and at least one layer of an insulating material, the conductive layer forming a portion of the inner lining;
the cover comprises a conductive portion; and
providing a spacer, the spacer comprising a conductive portion, the conductive portions of the spacer and the cover forming a portion of the inner lining.

18. The method of claim 6, comprising providing the substrate or the cover with one or more lead pads and electrically coupling the lead pads to the transducer.

19. The method of claim 18, further comprising:
providing the substrate or the cover with an electrical ground plane and, the electrical ground plane being electrically coupled to at least one of the lead pads.

20. The method of claim 6, providing a sealing ring, the sealing ring being attached to the housing adjacent the aperture.

21. A method for producing a MEMS transducer, the method comprising:
providing a printed circuit board comprising at least one layer of conductive material and at least one layer of insulating material;
providing a cover comprising at least one layer of conductive material;
providing and cooperating a spacer to the cover and the printed circuit board to form a housing, the spacer comprising a sidewall at least partially covered by a conductive layer, the conductive layer including a portion of an inner lining for providing a shield against an electromagnetic interference;
forming an aperture within the housing adapted for receiving a signal; and
mounting a transducer within the housing.

22. A method for producing a MEMS transducer, the method comprising:
providing a substrate including an upper surface having a recess formed within, the substrate comprising a layer of conductive material;
mounting a transducer to the upper surface overlapping at least a portion of the recess so that a back volume is formed between the transducer and the substrate;
placing a cover over the transducer, the cover comprising an aperture and a layer of conductive material;
providing and cooperating a spacer to the cover and the substrate to form a housing, the spacer comprising a conductive material; and
wherein the conductive layers electrically coupled to form an inner lining for providing a shield against an electromagnetic interference;
providing a sealing ring, the sealing ring formed on a surface of the substrate opposite the upper surface adjacent the back volume.

23. A method of producing a MEMS transducer, the method comprising:
providing a printed circuit board, the printed circuit board comprises at least one layer of a conductive material and at least one layer of an insulating material;
providing and coupling a transducer to the printed circuit board;

providing and joining a cover to the printed circuit board to form a housing, the housing defining an interior portion in which the transducer is disposed, and the cover comprises a conductive portion;

forming an aperture within the housing acoustically coupling the interior portion to an exterior portion of the housing for receiving a signal;

providing a spacer, the spacer comprises a conductive portion, disposing the spacer between the printed circuit board and the cover; and electrically shielding the transducer comprises electrically coupling the conductive layer and the conductive portions to form a shield against electromagnetic interference.

24. A method of producing a MEMS transducer, the method comprising:

providing a printed circuit bard, the printed circuit board comprises at least one layer of a conductive material and at least one layer of an insulating material;

providing and coupling a transducer to the printed circuit board;

providing and joining a cover to the printed circuit to form a housing, the housing defining an interior portion in which the transducer is disposed, and the cover comprises a conductive portion;

forming an aperture within the housing acoustically coupling the interior portion to an exterior portion of the housing for receiving a signal;

providing a spacer, the spacer comprises a conductive portion, disposing the spacer between the printed circuit board and the cover; and electrically shielding the transducer comprises providing a conductive adhesive to electrically couple the conductive layer and the conductive portions to form a shield against electromagnetic interference.

* * * * *

(12) EX PARTE REEXAMINATION CERTIFICATE (8517th)
United States Patent
Minervini

(10) Number: US 7,537,964 C1
(45) Certificate Issued: *Sep. 6, 2011

(54) METHOD OF FABRICATING A MINIATURE SILICON CONDENSER MICROPHONE

(76) Inventor: Anthony D. Minervini, Palos Hills, IL (US)

Reexamination Request:
No. 90/011,058, Jun. 23, 2010

Reexamination Certificate for:
Patent No.: 7,537,964
Issued: May 26, 2009
Appl. No.: 11/538,056
Filed: Oct. 3, 2006

(*) Notice: This patent is subject to a terminal disclaimer.

Related U.S. Application Data

(62) Division of application No. 09/886,854, filed on Jun. 21, 2001, now Pat. No. 7,166,910.
(60) Provisional application No. 60/253,543, filed on Nov. 28, 2000.

(51) Int. Cl.
*H01L 21/00* (2006.01)
*H04M 9/00* (2006.01)
*H04R 31/00* (2006.01)
*H04R 9/08* (2006.01)

(52) U.S. Cl. ............... 438/113; 438/125; 438/623; 29/594; 29/609.1; 381/355; 381/360; 455/575.1

(58) Field of Classification Search ............... None
See application file for complete search history.

(56) References Cited

U.S. PATENT DOCUMENTS

| | | | |
|---|---|---|---|
| 3,735,211 A | 5/1973 | Kapnias | |
| 4,222,277 A | 9/1980 | Kurtz | |
| 4,277,814 A | 7/1981 | Giachino et al. | |
| 4,314,226 A | 2/1982 | Oguro et al. | |
| 4,456,796 A | 6/1984 | Nakagawa et al. | |
| 4,533,795 A | 8/1985 | Baumhauer, Jr. et al. | 179/111 E |
| 4,558,184 A | 12/1985 | Busch-Vishniac et al. | |
| 4,691,363 A | 9/1987 | Khanna | |
| 4,984,268 A | 1/1991 | Brown et al. | 379/433 |
| 5,153,379 A | 10/1992 | Guzuk et al. | |
| 5,257,547 A | 11/1993 | Boyer | |
| 5,357,807 A | 10/1994 | Guckel | |
| 5,394,011 A | 2/1995 | Yamamoto et al. | |
| 5,490,220 A | 2/1996 | Loeppert | |
| 5,740,261 A | 4/1998 | Loeppert et al. | |
| 5,838,551 A | 11/1998 | Chan | |
| 5,852,320 A | 12/1998 | Ichihashi | |
| 5,870,482 A | 2/1999 | Loeppert et al. | |
| 5,886,876 A | 3/1999 | Yamaguchi | |
| 5,901,046 A | 5/1999 | Ohta et al. | |
| 5,999,821 A | 12/1999 | Kaschke | |
| 6,012,335 A | 1/2000 | Bashir et al. | |
| 6,052,464 A | 4/2000 | Harris et al. | 379/433 |
| 6,118,881 A | 9/2000 | Quinlan et al. | 381/356 |
| 6,157,546 A | 12/2000 | Petty et al. | |

(Continued)

FOREIGN PATENT DOCUMENTS

| | | |
|---|---|---|
| CA | 2315417 A1 | 2/2001 |
| WO | WO-00/42636 A2 | 7/2000 |
| WO | WO-01/20948 A2 | 3/2001 |
| WO | WO-01/41497 A1 | 6/2001 |

OTHER PUBLICATIONS

Henning, et al., "Microfluidic MEMS for Semiconductor Processing," IEEE Transactions on Components, Packaging, and Manufacturing Technology, Part B, vol. 21, No. 4, pp. 329–337, Nov. 4, 1998.

(Continued)

*Primary Examiner*—Steven B. Theriault

(57) ABSTRACT

A silicon condenser microphone package includes a transducer unit, a substrate, and a cover. The substrate includes an upper surface transducer unit is attached to the upper surface of the substrate and overlaps at least a portion of the recess wherein a back volume of the transducer unit is formed between the transducer unit and the substrate. The cover is placed over the transducer unit and either the cover or the substrate includes an aperture.

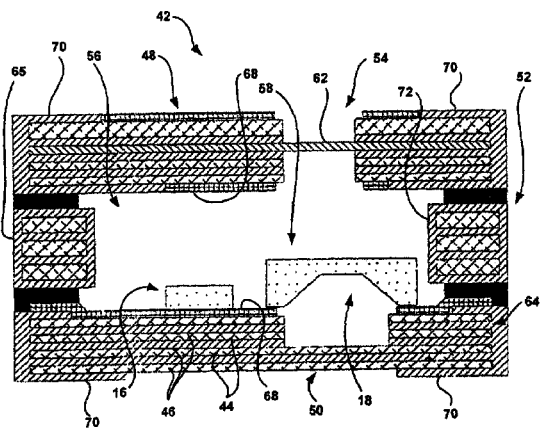

U.S. PATENT DOCUMENTS

| | | | |
|---|---|---|---|
| 6,163,071 | A | 12/2000 | Yamamura |
| 6,178,249 | B1 | 1/2001 | Hietanen et al. |
| 6,324,907 | B1 | 12/2001 | Halteren et al. ............... 73/431 |
| 6,522,762 | B1 | 2/2003 | Mullenborn et al. |
| 6,594,369 | B1 | 7/2003 | Une .......................... 381/174 |
| 7,003,127 | B1 | 2/2006 | Sjursen et al. |
| 7,080,442 | B2 | 7/2006 | Kawamura et al. |
| 7,092,539 | B2 | 8/2006 | Sheplak et al. |

OTHER PUBLICATIONS

Petersen et al., "Silicon Accelerometer Family; Manufactured for Automotive Applications," pp. 217–222, 1992.

C.S. Premachandran, et al., "Si–based Microphone Testing Methodology and Noise Reduction," pp. 588–592, Proceedings of SPIE, vol. 4019 (2000).

"Pressure Transducer Handbook," 1977, 4–2 to 4–5, 12–1 to 12–5, National Semiconductor Corp., USA.

Torkkeli et al., "Capacitive microphone with low–stress polysilicon membrane and high–stress polysilicon backplate," Sensors and Actuators, 2000, pp. 116–123, vol. 85.

Lau, John H., Ed., Ball Grid Array Technology, McGraw–Hill, Inc., 1995, USA, ISBN 0–07–036608–X (BGA Technology).

Torkkeli et al., "Capacitive Silicon Microphone," Physica Scripta, 1999, pp. 275–278, vol. T79.

Bever et al., "BICMOS Compatible Silicon Microphone Packaged as Surface Mount Device," 445–461, Sensors Expo (1999).

Kress, et al., "Integrated Silicon Pressure Sensor for Automotive Applications with Electronic Trimming," SAE Document 950533, Society of Automotive Engineers, 1995, USA.

Giasolli, Robert, "MEMS Packaging Introduction," Nov. 2000.

Harper, Charles A., Ed., Electronic Packaging and Interconnection Handbook, 2000, Chs. 7, 8, & 10, The McGraw–Hill Companies, Inc., USA.

Arnold et al., "MEMS–Based Acoustic Array Technology," 40th AIAA Aerospace Sciences Meeting and Exhibit, Jan. 14–17, 2002, Reno, Nevada.

David Patrick Arnold, Master's Thesis, "A MEMS–Based Directional Acoustic Array for Aeroacoustic Measurements." Univ. of Florida, 2001.

Gale, Bruce K., Dr., "MEMS Packaging," Microsystems Principles, Oct. 2001.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 6, 13, 15 and 18 are determined to be patentable as amended.

Claims 9-12, 14, 16 and 19-20, dependent on an amended claim, are determined to be patentable.

New claim 25 is added and determined to be patentable.

Claims 1-5, 7-8, 17 and 21-24 were not reexamined.

6. A method for producing a MEMS [transducer] *microphone*, the method comprising:

providing a *rigid* substrate;

providing and coupling a [transducer] *MEMS microphone die* to the substrate;

providing and joining a cover to the substrate to form a housing, the housing defining an interior portion in which the [transducer] *MEMS microphone die* is disposed; [and]

forming an aperture within the housing acoustically coupling the interior portion to an exterior portion of the housing for receiving a signal; and electrically shielding the [transducer] *MEMS microphone die* by associating with the housing an inner lining on a surface of the inner portion, the inner lining being a conductive material such that the conductive material provides an effective shield against electromagnetic interference.

13. The method of claim 6, further comprising:

forming a recess within the interior portion; and coupling the [transducer] *MEMS microphone die* to the recess to form a cavity.

15. The method of claim 6, further comprising:

forming a passage through the housing; and coupling the [transducer] *MEMS microphone die* to the passage to form at least a portion of a cavity.

18. The method of claim 6, comprising providing the substrate or the cover with one or more lead pads and electrically coupling the lead pads to the [transducer] *MEMS microphone die*.

*25. The method of claim 6,*

*wherein the substrate comprises FR-4 material.*

\* \* \* \* \*

(12) INTER PARTES REEXAMINATION CERTIFICATE (1072nd)
United States Patent
Minervini

(10) Number: US 7,537,964 C2
(45) Certificate Issued: *Mar. 17, 2015

(54) METHOD OF FABRICATING A MINIATURE SILICON CONDENSER MICROPHONE

(75) Inventor: Anthony D. Minervini, Palos Hills, IL (US)

(73) Assignee: JP Morgan Chase Bank, New York, NY (US)

Reexamination Request:
No. 95/001,849, Dec. 12, 2011

Reexamination Certificate for:
Patent No.: 7,537,964
Issued: May 26, 2009
Appl. No.: 11/538,056
Filed: Oct. 3, 2006

Reexamination Certificate C1 7,537,964 issued Sep. 6, 2011

( * ) Notice: This patent is subject to a terminal disclaimer.

Related U.S. Application Data

(62) Division of application No. 09/886,854, filed on Jun. 21, 2001, now Pat. No. 7,166,910.

(60) Provisional application No. 60/253,543, filed on Nov. 28, 2000.

(51) Int. Cl.
*H01L 21/00* (2006.01)
*H04M 9/00* (2006.01)
*H04R 31/00* (2006.01)
*H04R 9/08* (2006.01)

(52) U.S. Cl.
CPC ..................................... *H01L 21/00* (2013.01)
USPC ............. 438/113; 438/125; 438/623; 29/594; 29/609; 381/355; 381/360; 455/575.1

(58) Field of Classification Search
None
See application file for complete search history.

(56) References Cited

To view the complete listing of prior art documents cited during the proceeding for Reexamination Control Number 95/001,849, please refer to the USPTO's public Patent Application Information Retrieval (PAIR) system under the Display References tab.

*Primary Examiner* — Leonardo Andujar

(57) ABSTRACT

A silicon condenser microphone package includes a transducer unit, a substrate, and a cover. The substrate includes an upper surface transducer unit is attached to the upper surface of the substrate and overlaps at least a portion of the recess wherein a back volume of the transducer unit is formed between the transducer unit and the substrate. The cover is placed over the transducer unit and either the cover or the substrate includes an aperture.

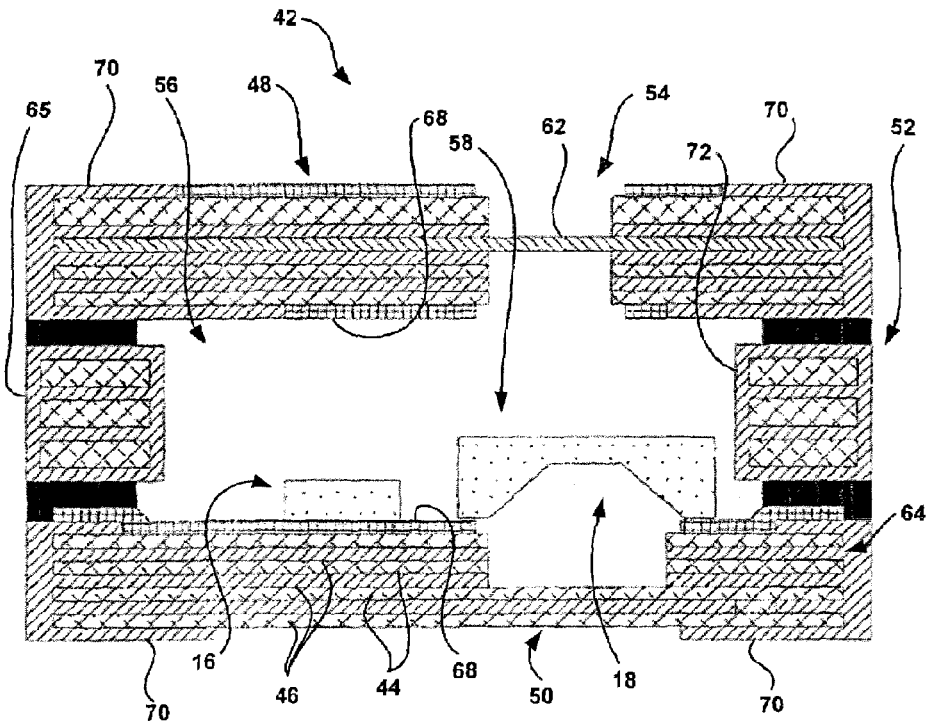

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 5-8, 14-16, 20, 22 and 25 are cancelled.

Claims 1, 9, 10, 12, 13 and 17-19 are determined to be patentable as amended.

Claims 2-4 and 11, dependent on an amended claim, are determined to be patentable.

New claims 26-30 are added and determined to be patentable.

Claims 21, 23 and 24 were not reexamined.

1. A method for producing a *surface mount* MEMS [transducer] *microphone*, the method comprising:
   providing a *rigid planar* substrate, the substrate comprising a first insulating layer, a first conductive layer, *a top surface, a plurality of bond pads on the top surface, a bottom surface, a plurality of solder pads on the bottom surface,* and an aperture, *wherein one of the plurality of solder pads has a circular shape with an opening in its center, and the aperture is disposed within the solder pad opening*;
   *physically* coupling a MEMS microphone transducer to the *top surface of the* substrate overlapping the aperture to form at least a portion of a cavity for the transducer;
   *electrically coupling the MEMS microphone transducer to one of the bond pads;*
   providing and attaching a *non-planar* cover to the *top surface of the* substrate, *thereby forming a surface mount package housing* to enclose and protect the transducer, the cover comprising a second insulating layer and a second conductive layer; and
   joining the first conductive layer, and the second conductive layer to form a shield against electromagnetic interference.

9. The method of claim [6] *26*, wherein the inner lining comprises one or more conductive layers formed within the *package* housing.

10. The method of claim [6] *26*, providing an environmental barrier, the environmental [baffler] *barrier* being disposed within the aperture.

12. The method of claim [6] *26*, wherein [providing the aperture comprises providing the aperture in the cover or the substrate or both the cover and the substrate] *the package housing comprises a second aperture disposed in either the cover or substrate that configures the MEMS microphone into a directional microphone*.

13. The method of claim [6] *26*, further comprising:
   forming a recess within the [interior portion] *substrate*; and
   coupling the MEMS microphone die to the recess to form a [cavity] *back volume*.

17. The method of claim [6] *26*, the substrate comprises at least one layer of a conductive material and at least one layer of an insulating material, the conductive layer forming a portion of the inner lining[;
   the cover comprises a conductive portion; and
   providing a spacer, the spacer comprising a conductive portion, the conductive portions of the spacer and the cover forming a portion of the inner lining].

18. The method of claim [6] *26* comprising providing the substrate [or the cover] with one or more lead pads and electrically coupling the lead pads to the MEMS microphone die.

19. The method of claim 18, further comprising:
   providing the substrate [or the cover] with an electrical [gronnd] *ground* plane and, the electrical ground plane being electrically coupled to at least one of the lead pads.

*26. A method for producing a surface mount MEMS microphone, the method comprising:*
   *providing a rigid planar substrate;*
   *providing and coupling a MEMS microphone die to the substrate;*
   *providing and joining a cover to the substrate to form a surface mount package housing to enclose and protect the MEMS microphone die, the package housing defining an interior portion in which the MEMS microphone die is disposed, wherein an aperture disposed in either the cover or substrate acoustically couples the interior portion to an exterior portion of the package housing to receive a signal; and*
   *electrically shielding the MEMS microphone die by associating with the package housing an inner lining on a surface of the inner portion, the inner lining being a conductive material such that the conductive material provides an effective shield against electromagnetic interference,*
   *wherein the substrate comprises a first insulating layer, a first conductive layer, a top surface, a plurality of lead pads on the top surface, a bottom surface, a plurality of solder pads on the bottom surface, and an aperture, wherein one of the plurality of solder pads has a circular shape with an opening in its center, and the aperture is disposed within the solder pad opening.*

*27. A method for producing a surface mount MEMS microphone package, the method comprising:*
   *providing a printed circuit board comprising at least one layer of conductive material and at least one layer of insulating material;*
   *providing a cover comprising at least one layer of conductive material, wherein either the printed circuit board or the cover further comprises an aperture adapted for receiving acoustic pressure;*
   *providing and cooperating a spacer to the cover and the printed circuit board to form a package housing, the spacer comprising a sidewall at least partially covered by a conductive layer, the conductive layer including a portion of an inner lining for providing a shield to protect against electromagnetic interference, wherein the forming of the package housing further comprises mounting a MEMS microphone die within the package housing; and*
   *wherein the aperture acoustically couples an interior portion of the package housing to an exterior portion of the package housing.*

*28. A method for producing a surface mount MEMS microphone package, the method comprising:* providing a substrate including an upper surface having a recess formed within, the substrate comprising a layer of conductive material;

mounting a MEMS microphone die to the upper surface overlapping at least a portion of the recess so that a back volume is formed between the transducer and the substrate;

providing a cover, the cover comprising an aperture and a layer of conductive material;

providing and cooperating a spacer to the cover and the substrate to form a housing, the spacer comprising a conductive material; and wherein the conductive layers electrically coupled to form an inner lining for providing a shield to protect against electromagnetic interference; and wherein the substrate comprises a retaining ring, the retaining ring formed on the upper a surface of the substrate and disposed between the upper surface and the MEMS microphone die.

29. A method of producing a surface mount MEMS microphone package, the method comprising:

providing a printed circuit board, the printed circuit board comprises at least one layer of a conductive material and at least one layer of an insulating material;

providing and coupling a MEMS microphone die to the printed circuit board;

providing a spacer, the spacer comprises a conductive portion;

providing and joining a cover and the spacer to the printed circuit board to form a surface mount package housing, the spacer being disposed between the printed circuit board and the cover, the package housing defining an interior portion in which the MEMS microphone die is disposed, and the cover comprises a conductive portion, wherein either the cover or the printed circuit board further comprises an aperture that acoustically couples the interior portion to an exterior portion of the housing for receiving acoustic pressure; and electrically shielding the MEMS microphone die by electrically coupling the conductive layer and the conductive portion to form a shield to protect against electromagnetic interference.

30. A method of producing a surface mount MEMS microphone package, the method comprising:

providing a printed circuit board, the printed circuit board comprises at least one layer of a conductive material and at least one layer of an insulating material;

providing a spacer, the spacer comprises a conductive portion;

providing and coupling a MEMS microphone die to the printed circuit board;

providing and joining a cover and the spacer to the printed circuit to form a surface mount package housing, the package housing defining an interior portion in which the MEMS microphone die is disposed, and the cover comprises a conductive portion, wherein either the cover or the printed circuit board further comprises an aperture that acoustically couples the interior portion to an exterior portion of the housing for receiving acoustic pressure; and electrically shielding the MEMS microphone die by providing a conductive adhesive to electrically couple the conductive layer and the conductive portion to form a shield to protect a against electromagnetic interference.

* * * * *